United States Patent
Hondo et al.

(10) Patent No.: US 9,048,265 B2
(45) Date of Patent: Jun. 2, 2015

(54) METHOD FOR MANUFACTURING SEMICONDUCTOR DEVICE COMPRISING OXIDE SEMICONDUCTOR LAYER

(71) Applicant: Semiconductor Energy Laboratory Co., Ltd., Atsugi-shi, Kanagawa-ken (JP)

(72) Inventors: Suguru Hondo, Atsugi (JP); Akihisa Shimomura, Atsugi (JP); Masaki Koyama, Atsugi (JP); Motomu Kurata, Isehara (JP); Kazuya Hanaoka, Fujisawa (JP); Sho Nagamatsu, Isehara (JP); Kosei Nei, Isehara (JP); Toru Hasegawa, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/897,502

(22) Filed: May 20, 2013

(65) Prior Publication Data
US 2013/0320332 A1 Dec. 5, 2013

(30) Foreign Application Priority Data
May 31, 2012 (JP) ................ 2012-123951

(51) Int. Cl.
*H01L 21/00* (2006.01)
*H01L 29/66* (2006.01)
*H01L 29/786* (2006.01)

(52) U.S. Cl.
CPC .... *H01L 29/66969* (2013.01); *H01L 29/78693* (2013.01); *H01L 29/78618* (2013.01); *H01L 29/7869* (2013.01); *H01L 29/78696* (2013.01)

(58) Field of Classification Search
USPC ......... 438/104, 308, 486, 584, 591, 689, 795; 257/43
See application file for complete search history.

(56) References Cited

U.S. PATENT DOCUMENTS

| | | |
|---|---|---|
| 5,528,032 A | 6/1996 | Uchiyama |
| 5,731,856 A | 3/1998 | Kim et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

(Continued)

*Primary Examiner* — Thanh V Pham
(74) *Attorney, Agent, or Firm* — Eric J. Robinson; Robinson Intellectual Property Law Office, P.C.

(57) ABSTRACT

A transistor including an oxide semiconductor film, which has stable electric characteristics is provided. A transistor including an oxide semiconductor film, which has excellent on-state characteristics is also provided. A semiconductor device in which an oxide semiconductor film having low resistance is formed and the resistance of a channel region of the oxide semiconductor film is increased. Note that an oxide semiconductor film is subjected to a process for reducing the resistance to have low resistance. The process for reducing the resistance of the oxide semiconductor film may be a laser process or heat treatment at a temperature higher than or equal to 450° C. and lower than or equal to 740° C., for example. A process for increasing the resistance of the channel region of the oxide semiconductor film having low resistance may be performed by plasma oxidation or implantation of oxygen ions, for example.

14 Claims, 26 Drawing Sheets

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,674,650 | B2 | 3/2010 | Akimoto et al. |
| 7,732,819 | B2 | 6/2010 | Akimoto et al. |
| 7,821,002 | B2 * | 10/2010 | Yamazaki et al. ............... 257/57 |
| 7,994,500 | B2 | 8/2011 | Kim et al. |
| 8,058,645 | B2 | 11/2011 | Jeong et al. |
| 8,148,779 | B2 | 4/2012 | Jeong et al. |
| 8,188,480 | B2 | 5/2012 | Itai |
| 8,202,365 | B2 | 6/2012 | Umeda et al. |
| 8,203,143 | B2 | 6/2012 | Imai |
| 8,207,014 | B2 | 6/2012 | Sasaki et al. |
| 8,216,878 | B2 | 7/2012 | Sasaki et al. |
| 8,241,949 | B2 * | 8/2012 | Miyanaga .................... 438/104 |
| 8,274,078 | B2 | 9/2012 | Itagaki et al. |
| 8,304,300 | B2 | 11/2012 | Sakata et al. |
| 8,400,187 | B2 * | 3/2013 | Yamazaki et al. ........... 326/102 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0295041 | A1 | 11/2010 | Kumomi et al. |
| 2010/0301329 | A1 | 12/2010 | Asano et al. |
| 2010/0320458 | A1 | 12/2010 | Umeda et al. |
| 2010/0320459 | A1 | 12/2010 | Umeda et al. |
| 2011/0003427 | A1 | 1/2011 | Sasaki et al. |
| 2011/0012105 | A1 | 1/2011 | Yamazaki et al. |
| 2011/0012117 | A1 | 1/2011 | Yamazaki et al. |
| 2011/0024750 | A1 | 2/2011 | Yamazaki et al. |
| 2011/0053322 | A1 | 3/2011 | Sasaki et al. |
| 2011/0147737 | A1 | 6/2011 | Yamazaki et al. |
| 2011/0193083 | A1 | 8/2011 | Kim et al. |
| 2011/0263085 | A1 | 10/2011 | Yamazaki |
| 2012/0119205 | A1 | 5/2012 | Taniguchi et al. |
| 2012/0187396 | A1 * | 7/2012 | Yamazaki et al. ............... 257/43 |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 06-275697 | | 9/1994 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2001-284580 | | 10/2001 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2006-165528 | | 6/2006 |
| JP | 2009-231613 | | 10/2009 |
| JP | 2010-016347 | | 1/2010 |
| JP | 4415062 | | 2/2010 |
| JP | 2010-067954 | | 3/2010 |
| JP | 2010-177431 | | 8/2010 |
| JP | 4571221 | | 10/2010 |

(56) References Cited

FOREIGN PATENT DOCUMENTS

| | | |
|---|---|---|
| JP | 2011-009724 | 1/2011 |
| JP | 2011-151377 | 8/2011 |
| JP | 2011-243976 | 12/2011 |
| JP | 2012-160679 | 8/2012 |
| JP | 2012-160679 A | 8/2012 |
| WO | WO-2004/114391 | 12/2004 |
| WO | WO2008/133345 | 11/2008 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO), and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

(56) References Cited

OTHER PUBLICATIONS

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, andYb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

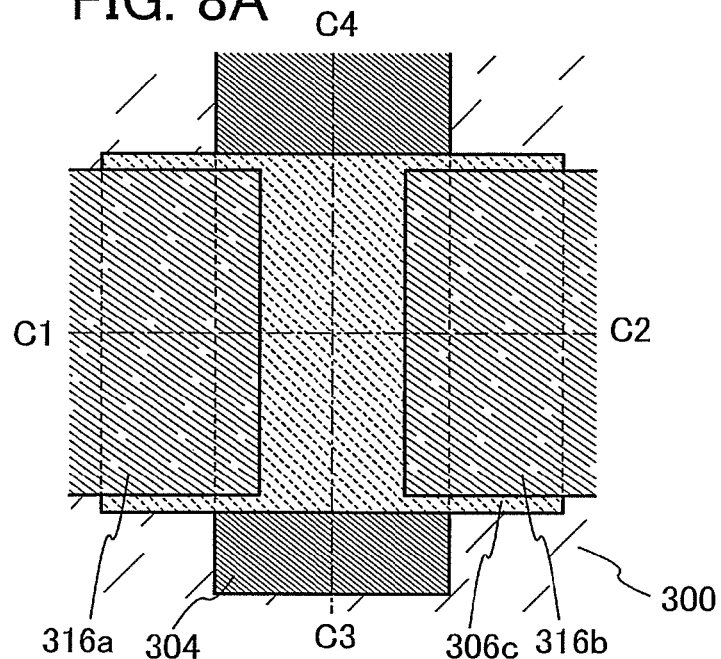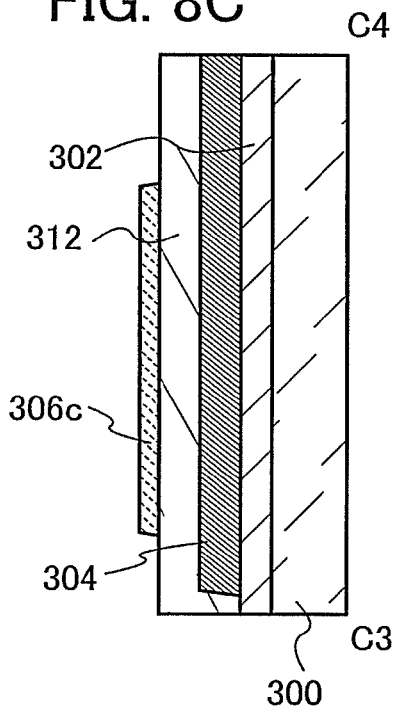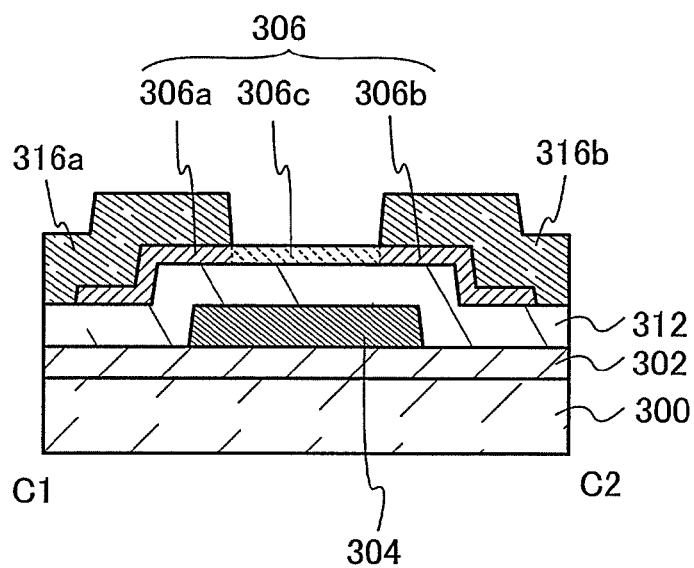

140mJ/cm²

5nm

201mJ/cm²

5nm

300mJ/cm²

5nm

349mJ/cm²

5nm

451mJ/cm²

5nm

451mJ/cm²

10nm

METHOD FOR MANUFACTURING SEMICONDUCTOR DEVICE COMPRISING OXIDE SEMICONDUCTOR LAYER

BACKGROUND OF THE INVENTION

1. Field of the Invention

The present invention relates to an oxide semiconductor film, a method for forming the oxide semiconductor film, a semiconductor device, and a method for manufacturing the semiconductor device.

Note that in this specification, a semiconductor device refers to any device that can function by utilizing semiconductor characteristics, and an electro-optical device, a semiconductor circuit, an electronic device, and the like are all semiconductor devices.

2. Description of the Related Art

A technique for forming a transistor by using a semiconductor film formed over a substrate having an insulating surface has attracted attention. The transistor is applied to a wide range of semiconductor devices such as an integrated circuit and a display device. A silicon film is known as a semiconductor film applicable to a transistor.

Whether an amorphous silicon film or a polycrystalline silicon film is used as a silicon film in a transistor depends on the purpose. For example, in the case of a transistor included in a large-sized display device, it is preferred to use an amorphous silicon film, which can be formed using the established technique for forming a film on a large-sized substrate. On the other hand, in the case of a transistor included in a high-performance display device where driver circuits are formed over the same substrate, it is preferred to use a polycrystalline silicon film, which can form a transistor having a high field-effect mobility. As a method for forming a polycrystalline silicon film, high-temperature heat treatment or a laser process which is performed on an amorphous silicon film has been known.

Further, in recent years, an oxide semiconductor film has attracted attention. For example, a transistor which includes an amorphous oxide film containing indium, gallium, and zinc and having a carrier density less than $10^{18}/cm^3$ is disclosed (see Patent Document 1).

An oxide semiconductor film can be formed by a sputtering method, and thus is suitable for a transistor in a large-sized display device. Moreover, a transistor including an oxide semiconductor film has a high field-effect mobility; therefore, a high-performance display device where driver circuits are formed over the same substrate can be obtained. In addition, there is an advantage that capital investment can be reduced because part of production equipment for a transistor including an amorphous silicon film can be retrofitted and utilized.

In addition, according to Patent Document 2, a transistor including an oxide semiconductor film can have an extremely low off-state current and can be favorably used for a semiconductor integrated circuit owing to such a low off-state current.

As a method for providing a transistor including an oxide semiconductor film with stable electric characteristics, a technique for doping an oxide semiconductor film with oxygen is disclosed (see Patent Document 3). With the technique disclosed in Patent Document 3, the impurity concentration and oxygen vacancies in the oxide semiconductor film can be reduced. As a result, variation in electric characteristics of the transistor including the oxide semiconductor film can be reduced and reliability can be improved.

A technique for reducing contact resistance by providing a buffer layer having low resistance between a source electrode (or a drain electrode) and the oxide semiconductor film to improve the on-state characteristics of a transistor including an oxide semiconductor film is also disclosed (see Patent Document 4).

REFERENCE

Patent Documents

[Patent Document 1] Japanese Published Patent Application No. 2006-165528
[Patent Document 2] Japanese Published Patent Application No. 2011-151377
[Patent Document 3] Japanese Published Patent Application No. 2011-243976
[Patent Document 4] Japanese Published Patent Application No. 2011-9724

SUMMARY OF THE INVENTION

An object is to provide a transistor including an oxide semiconductor film, which has stable electric characteristics.

Another object is to provide a transistor including an oxide semiconductor film, which has excellent on-state characteristics.

One embodiment of the present invention is a method for manufacturing a semiconductor device in which an oxide semiconductor film having low resistance is formed and the resistance of a channel region of the oxide semiconductor film is increased.

Note that an oxide semiconductor film is subjected to a process for reducing the resistance to have low resistance. The process for reducing the resistance of the oxide semiconductor film may be a laser process or heat treatment at a temperature higher than or equal to 450° C. and lower than or equal to 740° C., for example.

Specifically, the heat treatment at a temperature higher than or equal to 450° C. and lower than or equal to 740° C. may be performed in an inert gas atmosphere or under reduced pressure.

The laser process may be performed specifically with an excimer laser which emits light having an emission wavelength of 308 nm and an energy density greater than or equal to 100 mJ/cm² and less than or equal to 600 mJ/cm², preferably greater than or equal to 200 mJ/cm² and less than or equal to 500 mJ/cm², further preferably greater than or equal to 250 mJ/cm² and less than or equal to 400 mJ/cm². The conditions of the laser process are not limited to the above conditions.

With the laser process or the heat treatment at a temperature higher than or equal to 450° C. and lower than or equal to 740° C., the impurity concentration of the oxide semiconductor film can be reduced and an oxygen vacancy can be formed. In addition, the crystallinity of the oxide semiconductor film is improved. As a result, an oxide semiconductor film having low resistance can be obtained.

A process for increasing the resistance of the channel region of the oxide semiconductor film having low resistance may be performed by plasma oxidation or implantation of oxygen ions, for example.

The oxide semiconductor film having low resistance has low impurity concentration and has many oxygen vacancies. Accordingly, the resistance of the oxide semiconductor film having low resistance can be increased by plasma oxidation or implantation of oxygen ions for reducing oxygen vacancies. An oxide semiconductor film having high resistance which is obtained in such a manner is an oxide semiconductor film having low impurity concentration and few oxygen vacancies. In other words, sources of generating carriers and the like in such an oxide semiconductor film are extremely reduced. Thus, a transistor including such an oxide semiconductor film has extremely low off-state current and stable electric characteristics.

The resistance of a region which is not subjected to the process for increasing the resistance remains low. Thus, a transistor including the oxide semiconductor film has low parasitic resistance and has excellent on-state characteristics.

One embodiment of the present invention is a method for manufacturing a semiconductor device, including the following steps: forming an oxide semiconductor film over a substrate having an insulating surface; forming a pair of electrodes over the oxide semiconductor film after performing a process for reducing a resistance of the oxide semiconductor film; forming a gate insulating film over the oxide semiconductor film and the pair of electrodes after performing a process for increasing a resistance of a region of the oxide semiconductor film, which does not overlap with the pair of electrodes; and forming a gate electrode over the oxide semiconductor film with the gate insulating film therebetween.

Another embodiment of the present invention is a method for manufacturing a semiconductor device, including the following steps: forming an oxide semiconductor film over a substrate having an insulating surface; forming a gate insulating film over the oxide semiconductor film after performing a process for reducing a resistance of the oxide semiconductor film; forming a sacrificial layer overlapping with a part of the oxide semiconductor film with the gate insulating film therebetween; forming a first insulating film over the sacrificial layer; forming a second insulating film which does not cover a part of the gate insulating film; forming a conductive film over the gate insulating film and the second insulating film after performing a process for increasing a resistance of a region of the oxide semiconductor film, which does not overlap with the second insulating film; and forming a gate electrode by processing the conductive film so that a top surface of the second insulating film is exposed and a top surface of the processed conductive film is substantially flush with the top surface of the second insulating film. The second insulating film is formed in the following manner: a part of the first insulating film is removed so that a part of a top surface of the sacrificial layer is exposed and a top surface of the first insulating film is substantially flush with the part of the top surface of the sacrificial layer; a part of the sacrificial layer and a part of the rest of the first insulating film are removed so that a whole top surface of the sacrificial layer is exposed and a top surface of the sacrificial layer is substantially flush with a top surface of the first insulating film; and the sacrificial layer whose whole top surface is exposed is removed.

Another embodiment of the present invention is a method for manufacturing a semiconductor device, including the following steps: forming a gate electrode over a substrate having an insulating surface; forming a gate insulating film over the gate electrode; forming an oxide semiconductor film over the gate electrode with the gate insulating film therebetween; forming a pair of electrodes over the oxide semiconductor film after performing a process for reducing a resistance of the oxide semiconductor film; and performing a process for increasing a resistance of a region of the oxide semiconductor film, which does not overlap with the pair of electrodes.

Another embodiment of the present invention is a semiconductor device including a gate electrode, a gate insulating film in contact with the gate electrode, an oxide semiconductor film overlapping with the gate electrode with the gate insulating film therebetween, and a pair of electrodes over and in contact with the oxide semiconductor film. A crystallinity of a region of the oxide semiconductor film, which overlaps with the pair of electrodes, is higher than a crystallinity of a region of the oxide semiconductor film, which does not overlap with the pair of electrodes.

Another embodiment of the present invention is a semiconductor device including an oxide semiconductor film, a gate insulating film over the oxide semiconductor film, and a gate electrode over the oxide semiconductor film with the gate insulating film therebetween. A crystallinity of a region of the oxide semiconductor film, which does not overlap with the gate electrode, is higher than a crystallinity of a region of the oxide semiconductor film, which overlaps with the gate electrode.

A transistor including an oxide semiconductor film having reduced impurities and few oxygen vacancies can have stable electric characteristics.

A transistor including an oxide semiconductor film having low parasitic resistance can have excellent on-state characteristics.

BRIEF DESCRIPTION OF THE DRAWINGS

FIGS. 8A to 8C are a top view and cross-sectional views which illustrate an example of a transistor of one embodiment of the present invention.

DETAILED DESCRIPTION OF THE INVENTION

Figure 1A:
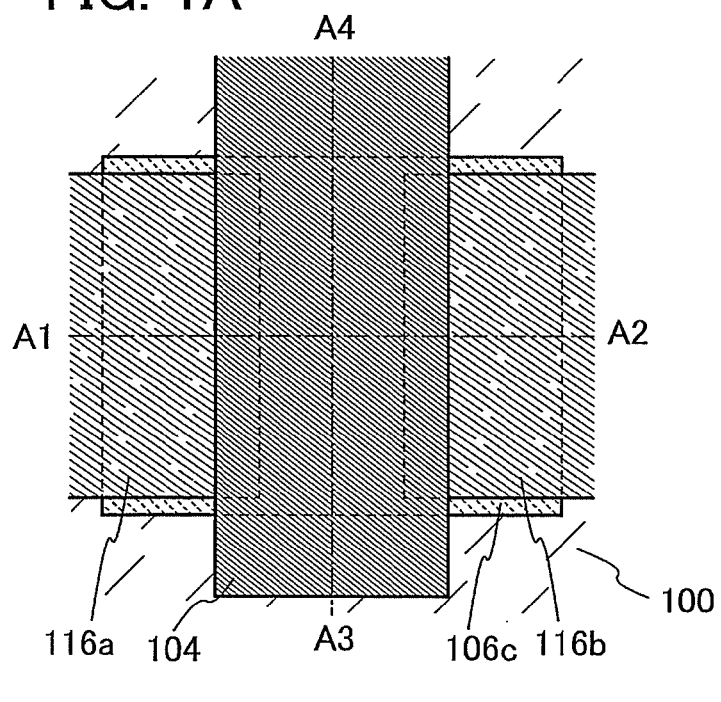
FIGS. 1A to 1C are a top view and cross-sectional views which illustrate an example of a transistor of one embodiment of the present invention.

Embodiments and examples of the present invention will be described in detail with reference to the accompanying drawings. However, the present invention is not limited to the description below, and it is easily understood by those skilled in the art that modes and details disclosed herein can be modified in a variety of ways. Therefore, the present invention is not construed as being limited to description of the embodiments and the examples. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that a voltage refers to a potential difference between a certain potential and a reference potential (e.g., a ground potential (GND) or a source potential) in many cases. Accordingly, a voltage can also be called a potential.

Even when the expression "to be electrically connected" is used in this specification, there is a case in which no physical connection is made and a wiring is just extended in an actual circuit.

Note that the ordinal numbers such as "first" and "second" in this specification are used for convenience and do not denote the order of steps or the stacking order of layers. In addition, the ordinal numbers in this specification do not denote particular names which specify the present invention.

(Embodiment 1)

In this embodiment, a transistor of one embodiment of the present invention and a method for manufacturing the transistor will be described.

Figure 1C:
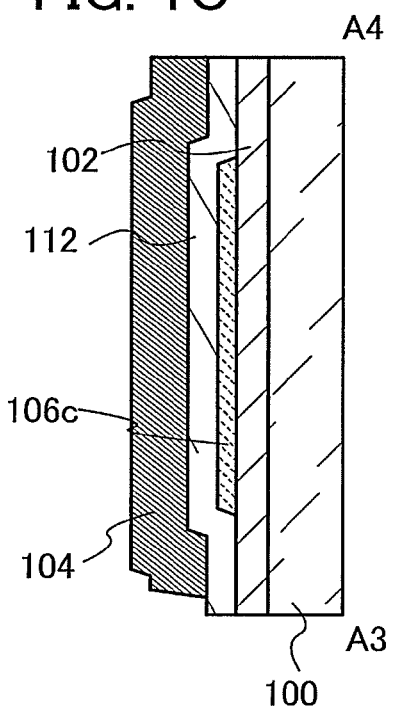
Figure 1B:
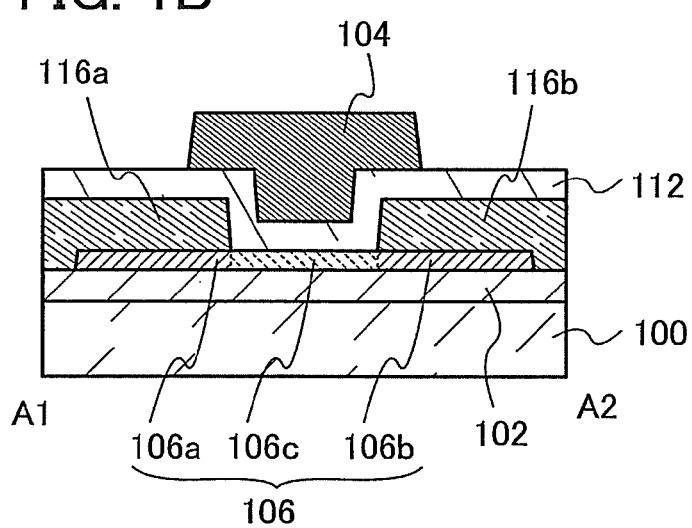

FIG. 1A is a top view of a transistor of one embodiment of the present invention. FIG. 1B is a cross-sectional view along dashed-dotted line A1-A2 of FIG. 1A. FIG. 1C is a cross-sectional view along dashed-dotted line A3-A4 of FIG. 1A. Note that a gate insulating film 112 and the like are not illustrated in FIG. 1A for simplicity.

The transistor illustrated in FIG. 1B includes a base insulating film 102 over a substrate 100; an oxide semiconductor film 106 which includes a low-resistance region 106a, a low-resistance region 106b, and a high-resistance region 106c and is over the base insulating film 102; a source electrode 116a and a drain electrode 116b in contact with the low-resistance region 106a and the low-resistance region 106b, respectively; the gate insulating film 112 over the oxide semiconductor film 106, the source electrode 116a, and the drain electrode 116b; and a gate electrode 104 over the oxide semiconductor film 106 with the gate insulating film 112 provided therebetween. Although the transistor illustrated in FIG. 1B includes the base insulating film 102, the present invention is not limited thereto. For example, the base insulating film 102 is not necessarily provided. Note that the source electrode 116a and the drain electrode 116b may be collectively referred to as a pair of electrodes.

Specifically, the low-resistance region 106a and the low-resistance region 106b included in the oxide semiconductor film 106 overlap with the source electrode 116a and the drain electrode 116b, respectively, in the top view of FIG. 1A. The high-resistance region 106c included in the oxide semiconductor film 106 overlaps with neither the source electrode 116a nor the drain electrode 116b in the top view of FIG. 1A. Thus, the low-resistance region 106a and the low-resistance region 106b of the oxide semiconductor film 106 function as a source region and a drain region of the transistor, respectively. Further, part of the high-resistance region 106c of the oxide semiconductor film 106 (a region between the source electrode 116a and the drain electrode 116b) functions as a channel region of the transistor.

The low-resistance region 106a and the low-resistance region 106b included in the oxide semiconductor film 106 have higher crystallinity than the high-resistance region 106c included in the oxide semiconductor film 106. It is particularly preferable that the low-resistance region 106a and the low-resistance region 106b included in the oxide semiconductor film 106 include polycrystalline regions. The high-resistance region 106c included in the oxide semiconductor film 106 may include an amorphous region.

The low-resistance region 106a and the low-resistance region 106b included in the oxide semiconductor film 106 may be formed using a c-axis aligned crystalline oxide semiconductor (CAAC-OS).

In most cases, a crystal part in the CAAC-OS fits inside a cube whose one side is less than 100 nm In an image obtained with a transmission electron microscope (TEM), a boundary between crystal parts in the CAAC-OS is not clearly detected. Further, with the TEM, a grain boundary in the CAAC-OS is not clearly found. Thus, in the CAAC-OS, a reduction in electron mobility due to the grain boundary is suppressed.

In each of the crystal parts included in the CAAC-OS, for example, a c-axis is aligned in a direction parallel to a normal vector of a surface where the oxide semiconductor film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

For the oxide semiconductor film 106, an In-M-Zn oxide may be used, for example. Here, a metal element M is an element whose bond energy with oxygen is higher than that of In and that of Zn. Alternatively, the metal element M is an element which has a function of suppressing elimination of oxygen from the In-M-Zn oxide. Owing to the effect of the metal element M, generation of oxygen vacancies in the oxide semiconductor film 106 is suppressed. Note that oxygen vacancies in the oxide semiconductor film 106 generate carriers in some cases. Thus, the effect of the metal element M suppresses an increase in the carrier density of the oxide semiconductor film 106 and an increase in off-state current. Furthermore, a change in the electrical characteristics of the transistor, which is caused by oxygen vacancies, can be reduced, whereby a highly reliable transistor can be obtained.

The metal element M can be, specifically, Al, Sc, Ti, V, Cr, Mn, Fe, Co, Ni, Ga, Y, Zr, Nb, Mo, Sn, La, Ce, Pr, Nd, Sm, Eu, Gd, Tb, Dy, Ho, Er, Tm, Yb, Lu, Hf, Ta, or W, and is preferably Al, Ti, Ga, Y, Zr, Ce, or Hf. As the metal element M, one or more elements of the above elements may be selected. Further, Si or Ge may be used instead of the metal element M.

The hydrogen concentration in the high-resistance region 106c included in the oxide semiconductor film 106 is lower than or equal to $2 \times 10^{20}$ atoms/cm$^3$, preferably lower than or equal to $5 \times 10^{19}$ atoms/cm$^3$, and more preferably lower than or equal to $1 \times 10^{19}$ atoms/cm$^3$. This is because hydrogen included in the oxide semiconductor film generates unintentional carriers in some cases. The generated carriers might increase the off-state current of the transistor and vary the electrical characteristics of the transistor. Thus, when the hydrogen concentration in the high-resistance region 106c, which is the channel region of the transistor is in the above range, an increase in the off-state current of the transistor and a change in the electrical characteristics of the transistor can be suppressed.

The oxide semiconductor film 106 has a wider band gap than a silicon film by approximately 1 eV to 2 eV. For that reason, in the transistor including the oxide semiconductor film 106, impact ionization is unlikely to occur and avalanche breakdown is unlikely to occur. That is, it can be said that, in the transistor including the oxide semiconductor film 106, hot-carrier degradation is unlikely to occur.

Furthermore, there are a small number of sources of generating carriers in the high-resistance region 106c included in the oxide semiconductor film 106; accordingly, the channel region can be completely depleted by an electric field of the gate electrode 104 even in the case where the oxide semiconductor film 106 has a large thickness (for example, greater than or equal to 15 nm and less than 100 nm). For that reason, in the transistor in which the high-resistance region 106c included in the oxide semiconductor film 106 is a channel region, an increase in off-state current and a change in threshold voltage due to a punch-through phenomenon are not caused.

The oxygen vacancies in the oxide semiconductor film can be evaluated by electron spin resonance (ESR). That is, an oxide semiconductor film without an oxygen vacancy (or with few oxygen vacancies) can be referred to as an oxide semiconductor film which does not have a signal due to oxygen vacancies evaluated by ESR. Specifically, the spin density attributed to oxygen vacancies in the high-resistance region 106c included in the oxide semiconductor film 106 is lower than $5 \times 10^{16}$ spins/cm$^3$. When the oxide semiconductor film has oxygen vacancies, a signal having symmetry is found at a g value of around 1.93 in ESR.

A transistor including the oxide semiconductor film can have an extremely low off-state current by a significant reduction in concentration of a donor (e.g., hydrogen or an oxygen vacancy) in the oxide semiconductor film. Specifically, the off-state current of a transistor with a channel length of 3 μm and a channel width of 1 μm can be lower than or equal to $1 \times 10^{-21}$ A or lower than or equal to $1 \times 10^{-25}$ A.

There is no particular limitation on the substrate 100. For example, a glass substrate, a ceramic substrate, a quartz substrate, or a sapphire substrate may be used as the substrate 100. Alternatively, a single crystal semiconductor substrate or a polycrystalline semiconductor substrate of silicon, silicon carbide, or the like, a compound semiconductor substrate silicon germanium or the like, a silicon-on-insulator (SOI) substrate, or the like may be used. Still alternatively, any of these substrates provided with a semiconductor element may be used as the substrate 100.

In the case of using a large glass substrate such as the fifth generation (1000 mm×1200 mm or 1300 mm×1500 mm); the sixth generation (1500 mm×1800 mm); the seventh generation (1870 mm×2200 mm); the eighth generation (2200 mm×2500 mm); the ninth generation (2400 mm×2800 mm); or the tenth generation (2880 mm×3130 mm) as the substrate 100, microfabrication is difficult in some cases due to the shrinkage of the substrate 100, which is caused by heat treatment or the like in a manufacturing process of the semiconductor device. Therefore, in the case where the above-described large glass substrate is used as the substrate 100, a substrate which is unlikely to shrink through the heat treatment is preferably used. For example, a large-sized glass substrate which has a shrinkage of 10 ppm or less, preferably 5 ppm or less, further preferably 3 ppm or less after heat treatment at 400° C., preferably at 450° C., and more preferably 500° C. for one hour may be used as the substrate 100.

Further alternatively, a flexible substrate may be used as the substrate 100. Note that as a method for providing a transistor over a flexible substrate, there is a method in which, after a transistor is formed over a non-flexible substrate, the transistor is separated from the non-flexible substrate and transferred to the substrate 100 which is a flexible substrate. In that case, a separation layer is preferably provided between the non-flexible substrate and the transistor.

As the base insulating film 102, a single layer of an insulating film such as a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film or a stack of any of these insulating films is used. It is preferable to use a single layer of an insulating film such as a silicon oxide film, a silicon oxynitride film, a silicon nitride oxide film, or a silicon nitride film or a stack of any of these insulating films.

The base insulating film 102 preferably contains excess oxygen in a region which overlaps with the high-resistance region 106c included in the oxide semiconductor film 106.

An insulating film containing excess oxygen can release oxygen by being subjected to heat treatment or the like. That is, an insulating film containing excess oxygen has a function of releasing oxygen by being subjected to heat treatment.

In the case where the base insulating film 102 contains excess oxygen in the region which overlaps with the high-resistance region 106c included in the oxide semiconductor film 106, oxygen vacancies in the high-resistance region 106c included in the oxide semiconductor film 106 can be reduced.

Here, to release oxygen by heat treatment means that the amount of released oxygen which is converted into oxygen atoms is greater than or equal to $1\times10^{18}$ atoms/cm$^3$, greater than or equal to $1\times10^{19}$ atoms/cm$^3$, or greater than or equal to $1\times10^{20}$ atoms/cm$^3$ in thermal desorption spectroscopy (TDS) analysis.

A method for measuring the amount of released oxygen using TDS is described below.

The total amount of released gas from a measurement sample in TDS is proportional to the integral value of the ion intensity of the released gas. Then, a comparison with a standard sample is made, whereby the total amount of the released gas can be calculated.

For example, the number of released oxygen molecules ($N_{O2}$) from a measurement sample can be calculated according to Formula (1) using the TDS results of a silicon wafer containing hydrogen at a predetermined density, which is the standard sample, and the TDS results of the measurement sample. Here, all gasses having a mass number of 32 which are obtained by the TDS are assumed to originate from an oxygen molecule. CH$_3$OH can also be given as a gas having a mass number of 32, but is not taken into consideration on the assumption that CH$_3$OH is unlikely to be present. Further, an oxygen molecule including an oxygen atom having a mass number of 17 or 18, which is an isotope of an oxygen atom, is also not taken into consideration because the proportion of such a molecule in the natural world is minimal.

[FORMULA 1]

$$N_{O2} = \frac{N_{H2}}{S_{H2}} \times S_{O2} \times \alpha \quad (1)$$

The value $N_{H2}$ is obtained by conversion of the number of hydrogen molecules desorbed from the standard sample into density. The integral value of ion intensity when the standard sample is analyzed by TDS is denoted by $S_{H2}$. Here, the reference value of the standard sample is expressed by $N_{H2}/S_{H2}$. The integral value of ion intensity when the measurement sample is analyzed by TDS is denoted by $S_{O2}$, and the coefficient affecting the ion intensity in the TDS is denoted by $\alpha$. For the details of Formula (1), refer to Japanese Published Patent Application No. H6-275697. Note that the amount of released oxygen was measured with a thermal desorption spectroscopy apparatus produced by ESCO Ltd., EMD-WA1000S/W using a silicon wafer containing hydrogen atoms at $1\times10^{16}$ atoms/cm$^2$ as the standard sample.

Further, in the TDS, oxygen is partly detected as an oxygen atom. The ratio between oxygen molecules and oxygen atoms can be calculated from the ionization rate of oxygen molecules. Note that, since the above $\alpha$ is determined considering the ionization rate of oxygen molecules, the number of released oxygen atoms can be estimated through the evaluation of the number of the released oxygen molecules.

Note that $N_{O2}$ is the number of released oxygen molecules. When the number of released oxygen molecules is converted into the number of released oxygen atoms, the number of released oxygen atoms is twice the number of released oxygen molecules.

The insulating film from which oxygen is released by heat treatment is an insulating film containing a peroxide radical. Specifically, the spin density attributed to a peroxide radical of the insulating film is higher than or equal to $5\times10^{17}$ spins/cm$^3$. Note that the insulating film containing a peroxide radical has a signal having asymmetry at a g value of around 2.01 in ESR.

The insulating film containing excess oxygen may be formed using oxygen-excess silicon oxide (SiO$_x$ (X>2)). In the oxygen-excess silicon oxide (SiO$_x$ (X>2)), the number of oxygen atoms per unit volume is more than twice the number of silicon atoms per unit volume. The number of silicon atoms and the number of oxygen atoms per unit volume are measured by RBS.

The source electrode 116a and the drain electrode 116b may be formed of a single layer or a stacked layer of a conductive film of a simple substance selected from aluminum, titanium, chromium, cobalt, nickel, copper, yttrium, zirconium, molybdenum, silver, tantalum, and tungsten; a nitride containing one or more kinds of the above substances; an oxide containing one or more kinds of the above substances; or an alloy containing one or more kinds of the above substances. Note that the source electrode 116a and the drain electrode 116b may have the same composition or different compositions.

As the gate insulating film 112, a single layer of an insulating film such as a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film or a stack of any of these insulating films is used. It is preferable to use a single layer of an insulating film such as a silicon oxide film, a silicon oxynitride film, a silicon nitride oxide film, or a silicon nitride film or a stack of any of these insulating films.

Note that the gate insulating film 112 preferably contains excess oxygen.

In the case where the gate insulating film 112 contains excess oxygen, oxygen vacancies in the high-resistance region 106c included in the oxide semiconductor film 106 can be reduced.

The gate electrode 104 may be formed of a single layer or a stacked layer of a conductive film of a simple substance selected from aluminum, titanium, chromium, cobalt, nickel, copper, yttrium, zirconium, molybdenum, silver, tantalum, and tungsten; a nitride containing one or more kinds of the above substances; an oxide containing one or more kinds of the above substances; or an alloy containing one or more kinds of the above substances.

In the aforementioned transistor, the low-resistance region 106a and the low-resistance region 106b which are included in the oxide semiconductor film 106 have high crystallinity. Thus, the transistor has low parasitic resistance and excellent on-state characteristics. Further, since the high-resistance region 106c included in the oxide semiconductor film 106 has low impurity concentration and few oxygen vacancies, the transistor has stable electric characteristics.

Next, a method for manufacturing the transistor illustrated in FIGS. 1A to 1C will be described. Note that the method for manufacturing the transistor will be described with reference to cross-sectional views each corresponding to FIG. 1B.

Figure 2A:
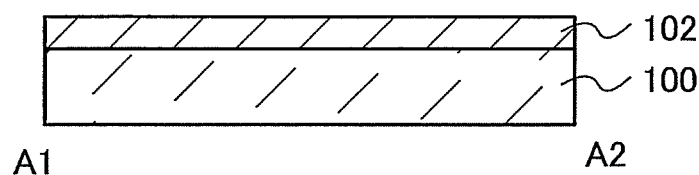
FIGS. 2A to 2C are cross-sectional views illustrating an example of a method for manufacturing a transistor of one embodiment of the present invention.

First, the base insulating film 102 is formed over the substrate 100 (see FIG. 2A). The base insulating film 102 can be formed using an insulating film selected from the insulating films given as examples of the base insulating film 102 and can be formed by a sputtering method, a chemical vapor deposition (CVD) method, a molecular beam epitaxy (MBE) method, an atomic layer deposition (ALD) method, or a pulsed laser deposition (PLD) method.

Figure 2B:
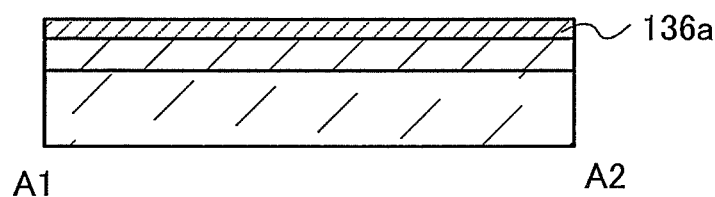

Then, an oxide semiconductor film 136a is formed (see FIG. 2B). The oxide semiconductor film 136a may be formed using an oxide film selected from the oxide films given as examples of the oxide semiconductor film 106 and may be formed by a sputtering method, a CVD method, an MBE method, an ALD method, or a PLD method.

Figure 2C:
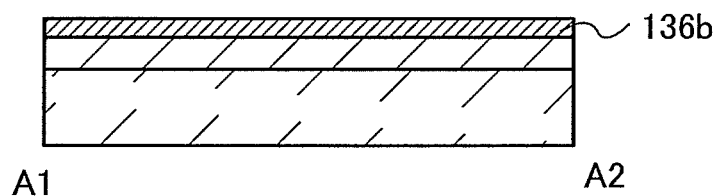

Subsequently, a process for reducing the resistance of the oxide semiconductor film 136a is performed to form an oxide semiconductor film 136b having low resistance (see FIG. 2C). The process for reducing the resistance of the oxide semiconductor film 136a may be a laser process or heat treatment at a temperature higher than or equal to 450° C. and lower than or equal to 740° C., for example.

Specifically, the heat treatment at a temperature higher than or equal to 450° C. and lower than or equal to 740° C. may be performed in an inert gas atmosphere or under reduced pressure. The heating time may be longer than or equal to 1 minute and shorter than or equal to 24 hours, preferably longer than or equal to 6 minutes and shorter than or equal to 5 hours, further preferably longer than or equal to 30 minutes and shorter than or equal to 2 hours.

The laser process may be performed specifically with an excimer laser which emits light having an emission wavelength of 308 nm and an energy density greater than or equal to 100 mJ/cm$^2$ and less than or equal to 600 mJ/cm$^2$, preferably greater than or equal to 200 mJ/cm$^2$ and less than or equal to 500 mJ/cm$^2$, further preferably greater than or equal to 250 mJ/cm$^2$ and less than or equal to 400 mJ/cm$^2$. The conditions of the laser process are not limited to the above conditions. In principle, a laser emitting light whose energy converted from the emission wavelength is higher than the band gap (about 2 eV to 4 eV) of the oxide semiconductor film to be subjected to the laser process may be used. For example, an excimer laser which emits light having an emission wavelength of 193 nm, 248 nm, or 351 nm may be used. Alternatively, a semiconductor laser, a solid-state laser, or the like may be used. Note that since the fundamental wavelengths of a semiconductor laser and a solid-state laser are large, a harmonic is used.

When the laser process is performed, the shrinkage of the substrate 100 can be practically reduced even when heat treatment at extremely high temperature is performed. With the laser process performed only on an intended region in the substrate 100, the time needed for the laser process can be shortened and productivity can be enhanced. Note that the substrate 100 may be subjected to the laser process while being heated.

With the laser process or the heat treatment at a temperature higher than or equal to 450° C. and lower than or equal to 740° C., the impurity concentration of the oxide semiconductor film 136a can be reduced and an oxygen vacancy can be formed. In addition, the crystallinity is improved. As a result, an oxide semiconductor film 136b having low resistance can be obtained.

Next, the oxide semiconductor film 136b is processed into an island-shaped oxide semiconductor film 136.

Then, a conductive film to be the source electrode 116a and the drain electrode 116b is formed. The conductive film can be selected from the conductive films given as examples of the source electrode 116a and the drain electrode 116b and can be formed by a sputtering method, a CVD method, an MBE method, an ALD method, or a PLD method.

Figure 3A:
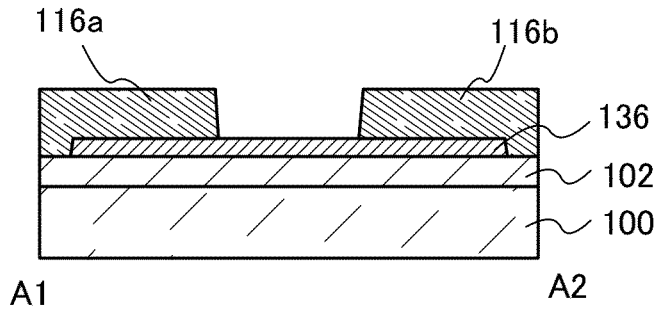
FIGS. 3A to 3D are cross-sectional views illustrating an example of a method for manufacturing a transistor of one embodiment of the present invention.

Then, a conductive film to be the source electrode 116a and the drain electrode 116b is processed to form the source electrode 116a and the drain electrode 116b (see FIG. 3A).

After that, a region of the oxide semiconductor film 136, which overlaps with neither the source electrode 116a nor the drain electrode 116b, is subjected to a process for increasing the resistance of the region of the oxide semiconductor film.

Figure 3B:
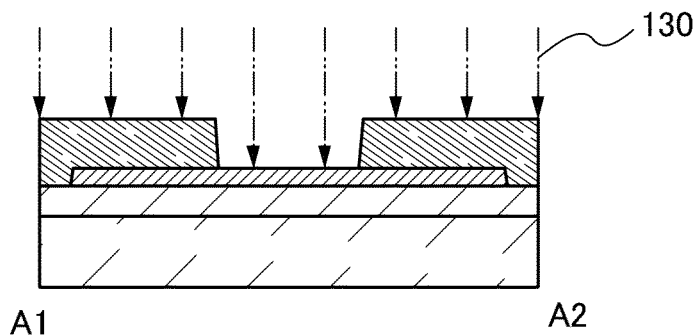

A process for increasing the resistance of the oxide semiconductor film 136 may be performed by plasma oxidation or implantation of oxygen ions, for example. In this embodiment, oxygen ions 130 are implanted (see FIG. 3B).

The oxide semiconductor film 136 having low resistance has low impurity concentration and has many oxygen vacancies. Accordingly, the resistance of the oxide semiconductor film having low resistance can be increased by plasma oxidation or implantation of oxygen ions for reducing oxygen vacancies. An oxide semiconductor film having high resistance which is obtained in such a manner is an oxide semiconductor film having low impurity concentration and few oxygen vacancies.

Figure 3C:
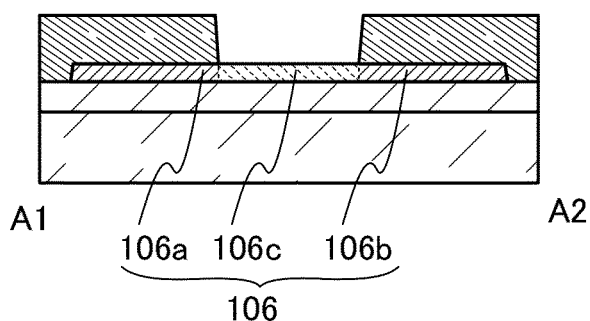

The process for increasing the resistance of the oxide semiconductor film 136 enables the region of the oxide semiconductor film 136, which overlaps with neither the source electrode 116a nor the drain electrode 116b, to be a high-resistance region. Meanwhile, regions of the oxide semiconductor film 136, which overlap with the source electrode 116a and the drain electrode 116b, are low-resistance regions. In this manner, the oxide semiconductor film 106 including the low-resistance region 106a, the low-resistance region 106b, and the high-resistance region 106c can be formed (see FIG. 3C).

Note that the process for increasing the resistance of the oxide semiconductor film 136 might oxidize surfaces of the source electrode 116a and the drain electrode 116b. An increase in parasitic resistance due to the oxidation of the surfaces of the source electrode 116a and the drain electrode 116b can be ignored when the source electrode 116a and the drain electrode 116b have sufficient thicknesses. Specifically, the thicknesses of the source electrode 116a and the drain electrode 116b are greater than or equal to 50 nm, preferably greater than or equal to 100 nm.

In some cases, the oxidation of the surfaces of the source electrode 116a and the drain electrode 116b can prevent leakage current between the gate electrode 104 and the source electrode 116a and between the gate electrode 104 and the drain electrode 116b.

A region of the base insulating film 102, which overlaps with the high-resistance region 106c included in the oxide semiconductor film 106, may contain excess oxygen by the process for increasing the resistance of the oxide semiconductor film 136 or by a similar process.

Next, the gate insulating film 112 is formed. The gate insulating film 112 can be formed using an insulating film selected from the insulating films given as examples of the gate insulating film 112 and can be formed by a sputtering method, a CVD method, an MBE method, an ALD method, or a PLD method.

The process for increasing the resistance of the oxide semiconductor film 136 can be performed after the formation of the gate insulating film 112 instead of after the formation of the source electrode 116a and the drain electrode 116b. In that case, a region of the gate insulating film 112 or the region of the base insulating film 102, which overlaps with the high-resistance region 106c included in the oxide semiconductor film 106, may contain excess oxygen by the process for increasing the resistance of the oxide semiconductor film 136 or by a similar process.

Then, a conductive film to be the gate electrode 104 is formed. The conductive film can be selected from the conductive films given as examples of the gate electrode 104 and can be formed by a sputtering method, a CVD method, an MBE method, an ALD method, or a PLD method.

Figure 3D:
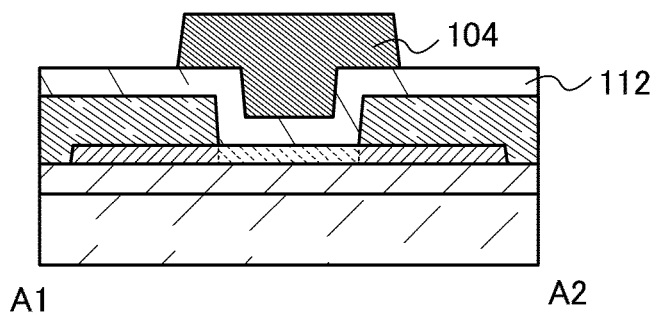

After that, the conductive film to be the gate electrode 104 is processed to form the gate electrode 104 (see FIG. 3D).

Through the above steps, the transistor illustrated in FIGS. 1A to 1C can be manufactured.

Regions which function as the source region and the drain region of the transistor have low resistance. Thus, a transistor including the oxide semiconductor film has low parasitic resistance and has excellent on-state characteristics. Further, sources of generating carriers and the like in the channel region of the oxide semiconductor film are extremely reduced. Thus, a transistor including such an oxide semiconductor film has low off-state current and stable electric characteristics.

This embodiment can be implemented in appropriate combination with any of the other embodiments and examples.

(Embodiment 2)

In this embodiment, a transistor having a structure different from the structures of the transistors in Embodiment 1 and a method of manufacturing the transistor will be described.

Figure 4A:
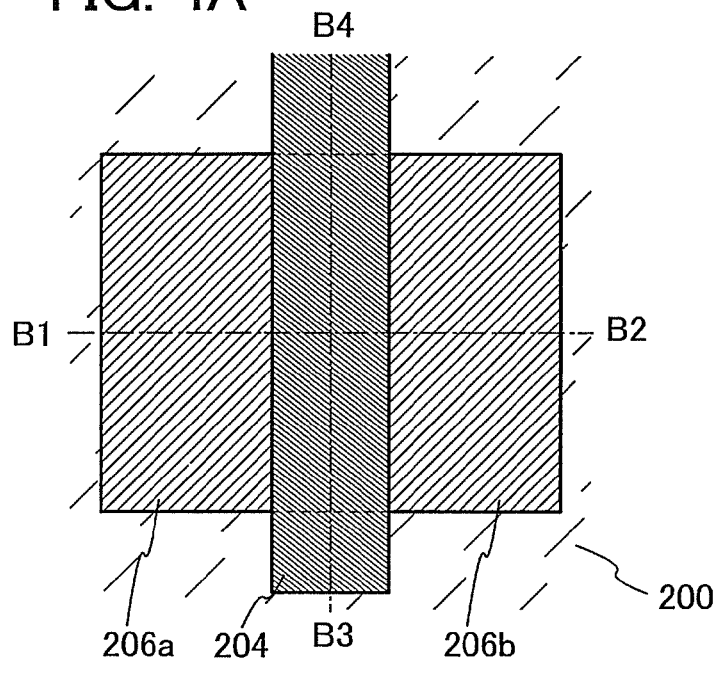
FIGS. 4A to 4C are a top view and cross-sectional views which illustrate an example of a transistor of one embodiment of the present invention.
Figure 4C:
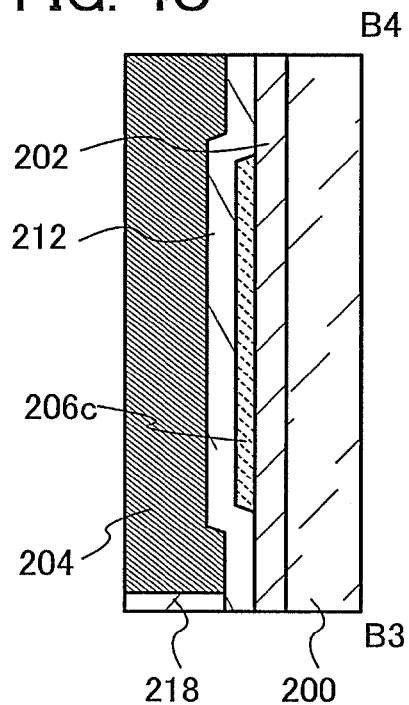
Figure 4B:
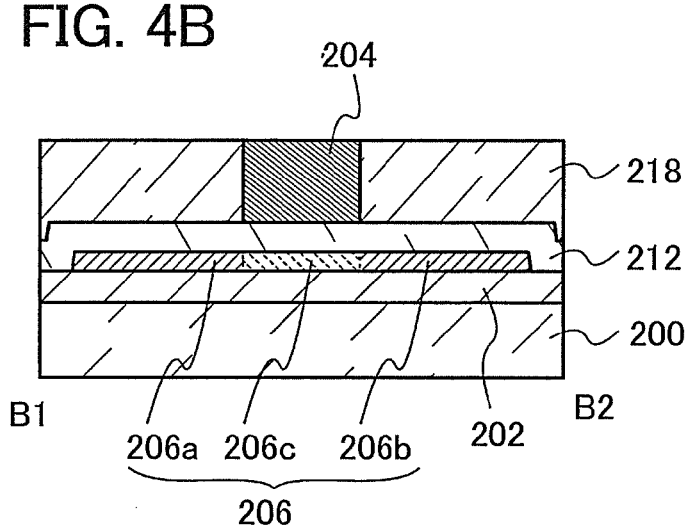

FIG. 4A is a top view of a transistor of one embodiment of the present invention. FIG. 4B is a cross-sectional view along dashed-dotted line B1-B2 of FIG. 4A. FIG. 4C is a cross-sectional view along dashed-dotted line B3-B4 of FIG. 4A. Note that a gate insulating film 212 and the like are not illustrated in FIG. 4A for simplicity.

The transistor illustrated in FIG. 4B includes a base insulating film 202 over a substrate 200; an oxide semiconductor film 206 which includes a low-resistance region 206a, a low-resistance region 206b, and a high-resistance region 206c and is over the base insulating film 202; the gate insulating film 212 over the oxide semiconductor film 206; a gate electrode 204 over the high-resistance region 206c included in the oxide semiconductor film 206 with the gate insulating film 212 provided therebetween; and an insulating film 218 which is over the gate insulating film 212. The top surfaces of the insulating film 218 and the gate electrode 204 are substantially flush with each other. Although the transistor illustrated in FIG. 4B includes the base insulating film 202, the present invention is not limited thereto. For example, the base insulating film 202 is not necessarily provided.

Specifically, the low-resistance region 206a and the low-resistance region 206b included in the oxide semiconductor film 206 do not overlap with the gate electrode 204. The high-resistance region 206c included in the oxide semiconductor film 206 overlaps with the gate electrode 204. Thus, the low-resistance region 206a and the low-resistance region 206b of the oxide semiconductor film 206 function as a source region and a drain region of the transistor, respectively. Further, part of the high-resistance region 206c of the oxide semiconductor film 206 functions as a channel region of the transistor.

For the oxide semiconductor film 206, refer to the description of the oxide semiconductor film 106. Further, for the low-resistance region 206a, the low-resistance region 206b, and the high-resistance region 206c included in the oxide semiconductor film 206, refer to the descriptions of the low-resistance region 106a, the low-resistance region 106b, and the high-resistance region 106c included in the oxide semiconductor film 106.

For the substrate 200, refer to the description of the substrate 100.

For the base insulating film 202, refer to the description of the base insulating film 102.

For the gate insulating film 212, refer to the description of the gate insulating film 112.

For the gate electrode 204, refer to the description of the gate electrode 104.

As the insulating film 218, a single layer of an insulating film such as a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film or a stack of any of these insulating films is used. It is preferable to use a single layer of an insulating film such as a silicon oxide film, a silicon oxynitride film, a silicon nitride oxide film, or a silicon nitride film or a stack of any of these insulating films.

Next, a method for manufacturing the transistor illustrated in FIGS. 4A to 4C will be described. Note that the method for manufacturing the transistor will be described with reference to cross-sectional views each corresponding to FIG. 4B.

First, the base insulating film 202 is formed over the substrate 200. For the base insulating film 202, refer to the description of the method for forming the base insulating film 102.

Next, an oxide semiconductor film 236 is formed. For the oxide semiconductor film 236, refer to the description of the method for forming the oxide semiconductor film 136.

Figure 5A:
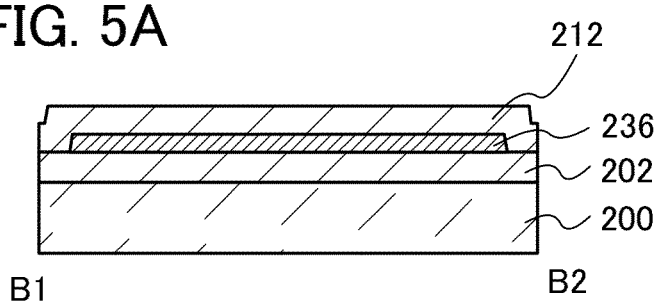
FIGS. 5A to 5D are cross-sectional views illustrating an example of a method for manufacturing a transistor of one embodiment of the present invention.

Then, the gate insulating film 212 is formed (see FIG. 5A). For the gate insulating film 212, refer to the description of the method for forming the gate insulating film 112.

Subsequently, an insulating film, a semiconductor film, or a conductive film, which is to be a sacrificial layer 234 is formed. The insulating film, the semiconductor film, or the conductive film, which is to be the sacrificial layer 234 may be formed by a sputtering method, a CVD method, an MBE method, an ALD method, or a PLD method. Note that the sacrificial layer 234 can be any kind of film, such as an insulating film, a semiconductor film, or a conductive film, as long as the film can be selectively etched from an insulating film 248 (which is to be the insulating film 218) formed later. In this embodiment, an insulating film, a semiconductor film, or a conductive film, which is to be the sacrificial layer 234, selected from the conductive films given as examples of the gate electrode 104 is used.

Figure 5B:
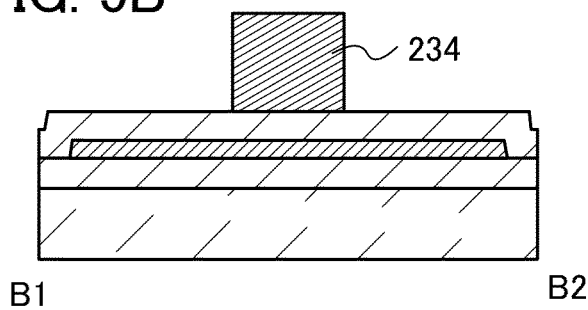

Next, the conductive film which is to be the sacrificial layer 234 is processed to form the sacrificial layer 234 (see FIG. 5B).

Figure 5C:
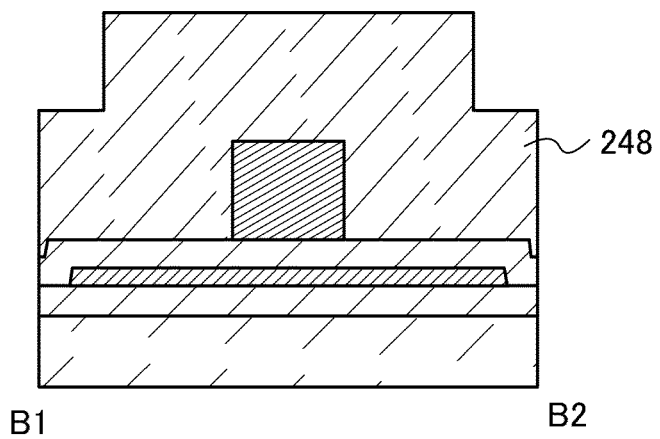

After that, the insulating film 248 is formed (see FIG. 5C). The insulating film 248 can be formed using an insulating film selected from the insulating films given as examples of the insulating film 218 and can be formed by a sputtering method, a CVD method, an MBE method, an ALD method, or a PLD method. It is preferable that the thickness of the insulating film 248 be larger than the thickness of the sacrificial layer 234 because later steps can be easily performed.

Figure 5D:
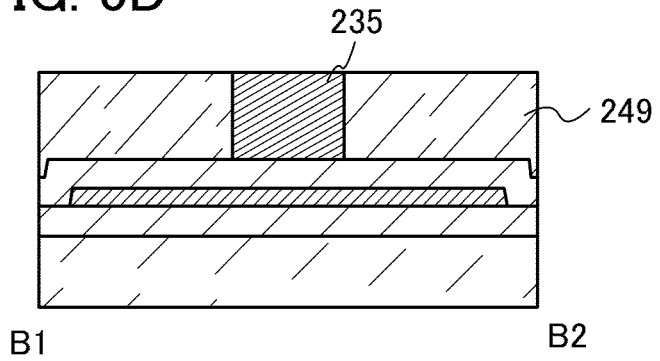

Then, part of the insulating film 248 is removed so that the top surface of the insulating film 248 is level and part of the top surface of the sacrificial layer 234 is exposed. After that, parts of the insulating film 248 and the sacrificial layer 234 are removed so that the top surfaces of the insulating film 248 and the sacrificial layer 234 are substantially flush with each other; thus, a sacrificial layer 235 whose whole top surface is exposed and an insulating film 249 whose top surface is substantially flush with that of the sacrificial layer 235 are formed (see FIG. 5D).

As a method for removing parts of the insulating film 248 and the sacrificial layer 234 so that the top surfaces of the insulating film 248 and the sacrificial layer 234 are substantially flush with each other, a chemical mechanical polishing (CMP) process may be used. Alternatively, a planarization film may be formed so that its top surface is level and then be etched from the top with the etching rate controlled.

Figure 6A:
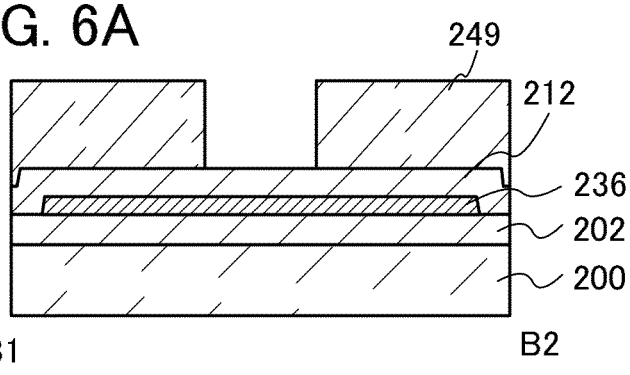
FIGS. 6A to 6D are cross-sectional views illustrating an example of a method for manufacturing a transistor of one embodiment of the present invention.

Next, the sacrificial layer 235 is removed by an etching process under conditions that the sacrificial layer 235 is etched, but the insulating film 249 is not etched (see FIG. 6A). By removal of the sacrificial layer 235, the insulating film 249 exposes part of the gate insulating film 212.

Note that part of the gate insulating film 212 may be removed together with the sacrificial layer 235.

Subsequently, a region of the oxide semiconductor film 236, which does not overlap with the insulating film 249, is subjected to a process for increasing the resistance of the oxide semiconductor film.

Figure 6B:
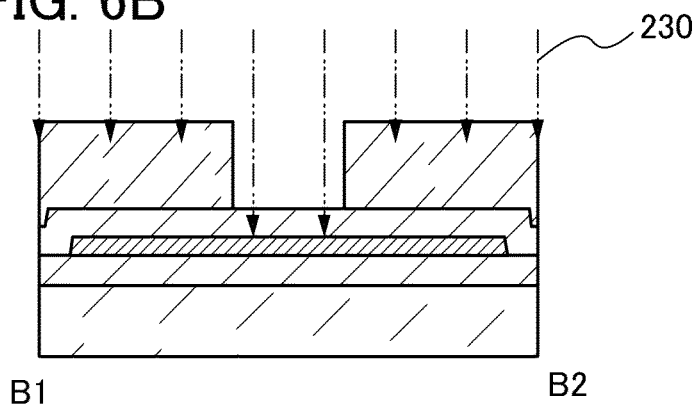

A process for increasing the resistance of the oxide semiconductor film 236 may be performed by plasma oxidation or implantation of oxygen ions, for example. In this embodiment, oxygen ions 230 are implanted (see FIG. 6B).

The oxide semiconductor film 236 having low resistance has low impurity concentration and has many oxygen vacancies. Accordingly, the resistance of the oxide semiconductor film having low resistance can be increased by plasma oxidation or implantation of oxygen ions for reducing oxygen vacancies. An oxide semiconductor film having high resistance which is obtained in such a manner is an oxide semiconductor film having low impurity concentration and few oxygen vacancies.

Figure 6C:
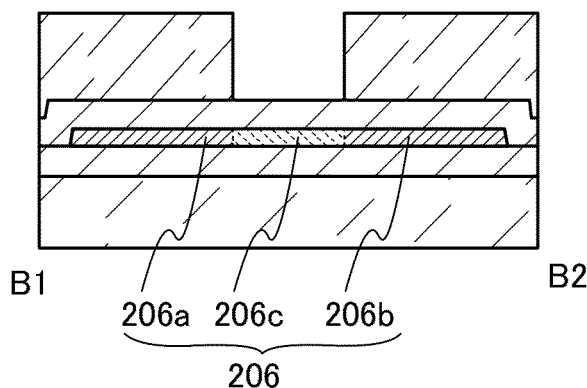

The process for increasing the resistance of the oxide semiconductor film 236 enables the region of the oxide semiconductor film 236, which does not overlap with the insulating film 249, to be a high-resistance region. Meanwhile, regions of the oxide semiconductor film 236, which overlap with the insulating film 249, are low-resistance regions. In this manner, the oxide semiconductor film 206 including the low-resistance region 206a, the low-resistance region 206b, and the high-resistance region 206c can be formed (see FIG. 6C).

Note that a region of the gate insulating film 212, which overlaps with the high-resistance region 206c included in the oxide semiconductor film 206, or a region of the base insulating film 202, which overlaps with the high-resistance region 206c included in the oxide semiconductor film 206, may contain excess oxygen by the process for increasing the resistance of the oxide semiconductor film 236 or by a similar process.

After that, part of the gate insulating film 212 may be removed.

In the case where the part of the gate insulating film 212 is removed together with the sacrificial layer 235 or in the case where the part of the gate insulating film 212 is removed after the process for increasing the resistance of the oxide semiconductor film 236, a gate insulating film is formed at this time.

Figure 6D:
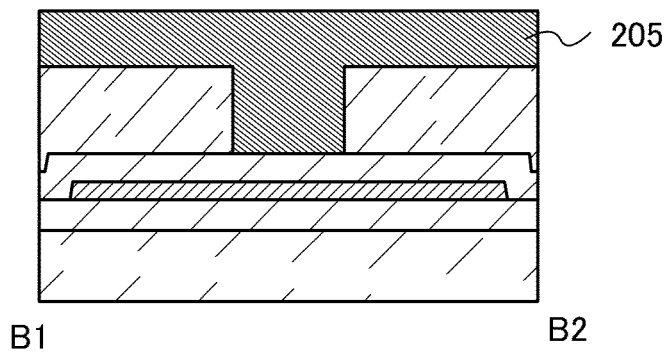

Then, a conductive film 205 is formed (see FIG. 6D). For the conductive film 205, refer to the description of the method for forming the conductive film which is to be the gate electrode 104.

Figure 7A:
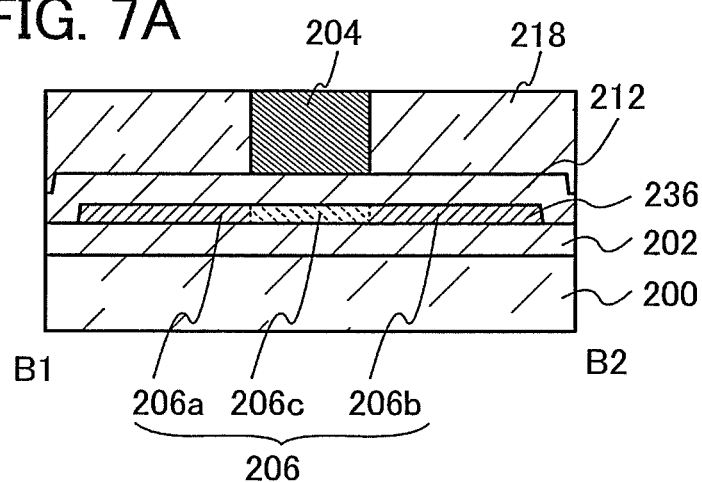
FIGS. 7A and 7B are cross-sectional views illustrating an example of a method for manufacturing a transistor of one embodiment of the present invention.

Next, part of the conductive film 205 is removed so that the top surface of the conductive film 205 is level and part of the top surface of the insulating film 249 is exposed. After that, parts of the insulating film 249 and the conductive film 205 are removed so that the top surfaces of the insulating film 249 and the conductive film 205 are substantially flush with each other; thus, the gate electrode 204 and the insulating film 218 whose top surface is substantially flush with that of the gate electrode 204 are formed (see FIG. 7A). Note that with such removal, an effect of unevenness due to the substrate 200 and other layers can be reduced, which enables the yield of the transistor to be improved.

Through the above steps, the transistor illustrated in FIGS. 4A to 4C can be manufactured.

Regions which function as the source region and the drain region of the transistor have low resistance. Thus, a transistor including the oxide semiconductor film has low parasitic resistance and has excellent on-state characteristics. Further, sources of generating carriers and the like in the channel region of the oxide semiconductor film are extremely reduced. Thus, a transistor including such an oxide semiconductor film has low off-state current and stable electric characteristics.

Figure 7B:
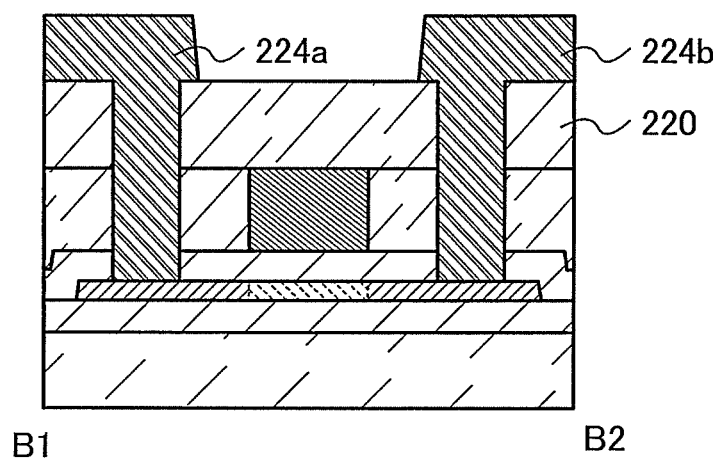

An insulating film and a wiring over the insulating film may be formed subsequently. An example of a method for forming the wiring is described below. First, an insulating film 220 is formed. Next, the gate insulating film 212, the insulating film 218, and the insulating film 220 are processed to expose the low-resistance region 206a and the low-resistance region 206b which are included in the oxide semiconductor film 206. Then, a conductive film which is to be a wiring 224a and a wiring 224b is formed and is processed to form the wiring 224a and the wiring 224b (see FIG. 7B).

For detailed method for forming the insulating film and the wiring over the insulating film, refer to the description of the method for forming another insulating film, another conductive film, or the like.

This embodiment can be implemented in appropriate combination with any of the other embodiments and examples.

(Embodiment 3)

In this embodiment, a transistor having a structure different from the structures of the transistors in Embodiment 1 and Embodiment 2 and a method of manufacturing the transistor will be described.

FIG. 8A is a top view of a transistor of one embodiment of the present invention. FIG. 8B is a cross-sectional view along dashed-dotted line C1-C2 of FIG. 8A. FIG. 8C is a cross-sectional view along dashed-dotted line C3-C4 of FIG. 8A. Note that a gate insulating film 312 and the like are not illustrated in FIG. 8A for simplicity.

The transistor illustrated in FIG. 8B includes a base insulating film 302 over a substrate 300; a gate electrode 304 over the base insulating film 302; the gate insulating film 312 over the gate electrode 304; an oxide semiconductor film 306 which includes a low-resistance region 306a, a low-resistance region 306b, and a high-resistance region 306c and is over the gate electrode 304 with the gate insulating film 312 provided therebetween; and a source electrode 316a and a drain electrode 316b in contact with the low-resistance region 306a and the low-resistance region 306b, respectively. Although the transistor illustrated in FIG. 8B includes the base insulating film 302, the present invention is not limited thereto. For example, the base insulating film 302 is not necessarily provided. Note that the source electrode 316a and the drain electrode 316b may be collectively referred to as a pair of electrodes.

Specifically, the low-resistance region 306a and the low-resistance region 306b included in the oxide semiconductor film 306 overlap with the source electrode 316a and the drain electrode 316b, respectively. The high-resistance region 306c included in the oxide semiconductor film 306 overlaps with neither the source electrode 316a nor the drain electrode 316b. Thus, the low-resistance region 306a and the low-resistance region 306b of the oxide semiconductor film 306 function as a source region and a drain region of the transistor, respectively. Further, part of the high-resistance region 306c of the oxide semiconductor film 306 (a region between the source electrode 316a and the drain electrode 316b) functions as a channel region of the transistor.

For the oxide semiconductor film 306, refer to the description of the oxide semiconductor film 106. Further, for the low-resistance region 306a, the low-resistance region 306b, and the high-resistance region 306c included in the oxide semiconductor film 306, refer to the descriptions of the low-resistance region 106a, the low-resistance region 106b, and the high-resistance region 106c included in the oxide semiconductor film 106.

For the substrate 300, refer to the description of the substrate 100.

For the base insulating film 302, refer to the description of the base insulating film 102.

For the gate electrode 304, refer to the description of the gate electrode 104.

For the gate insulating film 312, refer to the description of the gate insulating film 112.

For the source electrode 316a and the drain electrode 316b, refer to the description of the source electrode 116a and the drain electrode 116b.

Although not illustrated in FIGS. 8A to 8C, a protective insulating film may be provided over the oxide semiconductor film 306, the source electrode 316a, and the drain electrode 316b.

As the protective insulating film, a single layer of an insulating film such as a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film or a stack of any of these insulating films is used. It is preferable to use a single layer of an insulating film such as a silicon oxide film, a silicon oxynitride film, a silicon nitride oxide film, or a silicon nitride film or a stack of any of these insulating films.

Note that the protective insulating film preferably contains excess oxygen. In the case where the protective insulating film contains excess oxygen, oxygen vacancies in the high-resistance region 306c included in the oxide semiconductor film 306 can be reduced.

A back gate electrode may be provided over the oxide semiconductor film 306 with the protective insulating film provided therebetween. The threshold voltage can be controlled easily owing to the back gate electrode. Moreover, the on-state current of the transistor can be increased by electrically connecting the back gate electrode to the gate electrode 304. Alternatively, the off-state current of the transistor can be reduced by setting the potential of the back gate electrode to GND or a negative potential (a potential which is lower than that of the source of the transistor or lower than GND).

Next, a method for manufacturing the transistor illustrated in FIGS. 8A to 8C will be described. Note that the method for manufacturing the transistor will be described with reference to cross-sectional views each corresponding to FIG. 8B.

Figure 9A:
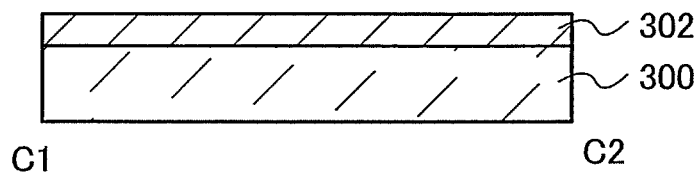
FIGS. 9A to 9D are cross-sectional views illustrating an example of a method for manufacturing a transistor of one embodiment of the present invention.

First, the base insulating film 302 is formed over the substrate 300 (see FIG. 9A). For the base insulating film 302, refer to the description of the method for forming the base insulating film 102.

Next, a conductive film to be the gate electrode 304 is formed. For the conductive film, refer to the description of the method for forming the conductive film which is to be the gate electrode 104.

Figure 9B:
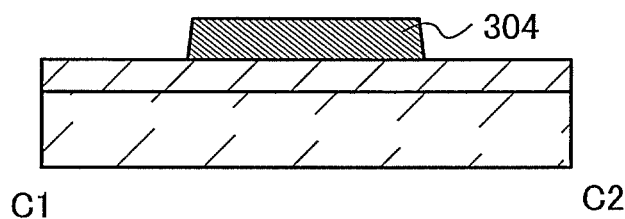

After that, the conductive film to be the gate electrode 304 is processed to form the gate electrode 304 (see FIG. 9B).

Figure 9C:
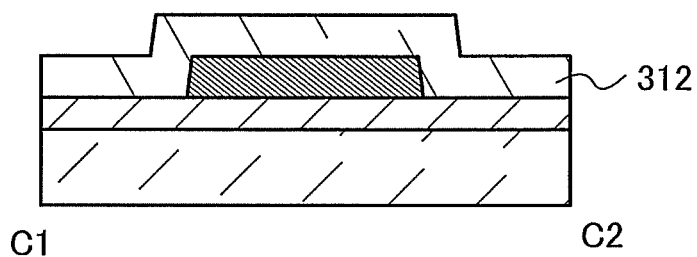

Then, the gate insulating film 312 is formed (see FIG. 9C). For the gate insulating film 312, refer to the description of the method for forming the gate insulating film 112.

Figure 9D:
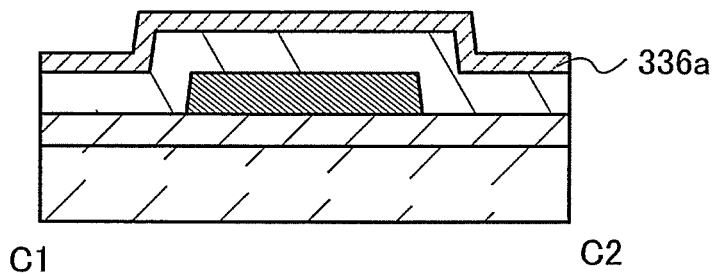

Next, an oxide semiconductor film 336a is formed (see FIG. 9D). For the oxide semiconductor film 336a, refer to the description of the method for forming the oxide semiconductor film 136a.

Figure 10A:
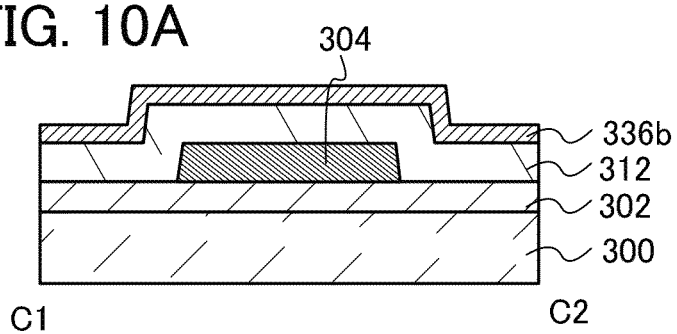
FIGS. 10A to 10D are cross-sectional views illustrating an example of a method for manufacturing a transistor of one embodiment of the present invention.

Subsequently, process for reducing the resistance of the oxide semiconductor film 336a is performed to form an oxide semiconductor film 336b having low resistance (see FIG. 10A). For the process for reducing the resistance of the oxide semiconductor film 336a, refer to the description in Embodiment 1.

Next, the oxide semiconductor film 336b is processed into an island-shaped oxide semiconductor film 336.

Then, a conductive film to be the source electrode 316a and the drain electrode 316b is formed. For the conductive film, refer to the description of the conductive film to be the source electrode 116a and the drain electrode 116b.

Figure 10B:
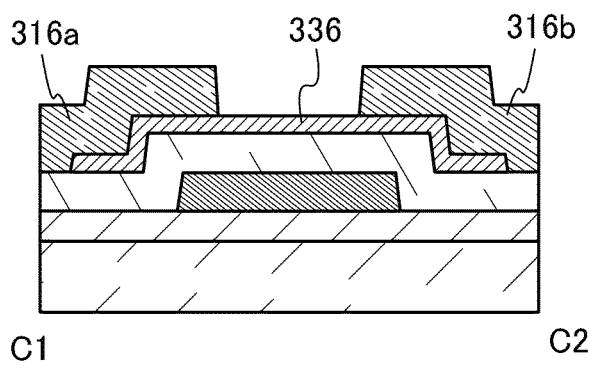

Then, a conductive film to be the source electrode 316a and the drain electrode 316b is processed to form the source electrode 316a and the drain electrode 316b (see FIG. 10B).

After that, a region of the oxide semiconductor film 336, which overlaps with neither the source electrode 316a nor the drain electrode 316b, is subjected to a process for increasing the resistance of the region of the oxide semiconductor film.

Figure 10C:
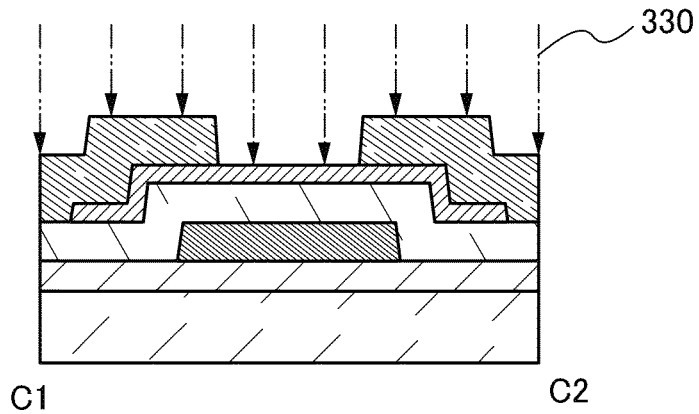

For a process for increasing the resistance of the oxide semiconductor film 336, refer to the description in Embodiment 1. In this embodiment, oxygen ions 330 are implanted (see FIG. 10C).

The oxide semiconductor film 336 having low resistance has low impurity concentration and has many oxygen vacancies. Accordingly, the resistance of the oxide semiconductor film having low resistance can be increased by plasma oxidation or implantation of oxygen ions for reducing oxygen vacancies. An oxide semiconductor film having high resistance which is obtained in such a manner is an oxide semiconductor film having low impurity concentration and few oxygen vacancies.

Figure 10D:
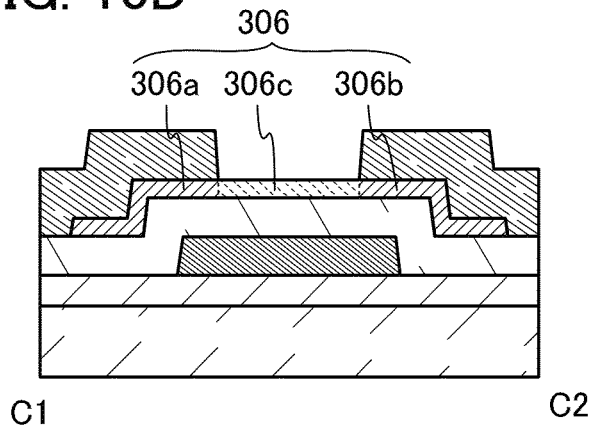

The process for increasing the resistance of the oxide semiconductor film 336 enables the region of the oxide semiconductor film 336, which overlaps with neither the source electrode 316a nor the drain electrode 316b, to be a high-resistance region. Meanwhile, regions of the oxide semiconductor film 336, which overlap with the source electrode 316a and the drain electrode 316b, are low-resistance regions. In this manner, the oxide semiconductor film 306 including the low-resistance region 306a, the low-resistance region 306b, and the high-resistance region 306c can be formed (see FIG. 10D).

Note that the process for increasing the resistance of the oxide semiconductor film 336 might oxidize surfaces of the source electrode 316a and the drain electrode 316b. An increase in parasitic resistance due to the oxidation of the surfaces of the source electrode 316a and the drain electrode 316b can be ignored when the source electrode 316a and the drain electrode 316b have sufficient thicknesses. Specifically, the thicknesses of the source electrode 316a and the drain electrode 316b are greater than or equal to 50 nm, preferably greater than or equal to 100 nm.

A region of the gate insulating film 312, which overlaps with the high-resistance region 306c included in the oxide semiconductor film 306, may contain excess oxygen by the process for increasing the resistance of the oxide semiconductor film 336 or by a similar process.

Through the above steps, the transistor illustrated in FIGS. 8A to 8C can be manufactured.

Regions which function as the source region and the drain region of the transistor have low resistance. Thus, a transistor including the oxide semiconductor film has low parasitic resistance and has excellent on-state characteristics. Further, sources of generating carriers and the like in the channel region of the oxide semiconductor film are extremely reduced. Thus, a transistor including such an oxide semiconductor film has low off-state current and stable electric characteristics.

This embodiment can be implemented in appropriate combination with any of the other embodiments and examples.

(Embodiment 4)

In this embodiment, a logic circuit which is a semiconductor device according to one embodiment of the present invention is described.

Figure 11A:
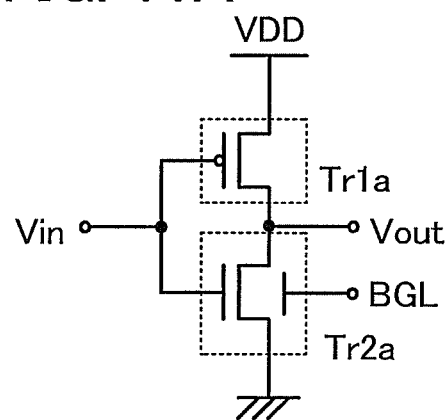
FIGS. 11A and 11B are a circuit diagram and a cross-sectional view of a semiconductor device of one embodiment of the present invention.

FIG. 11A is a circuit diagram illustrating an example of a NOT circuit (inverter) using a p-channel transistor and an n-channel transistor.

A transistor Tr1a which is a p-channel transistor may be, for example, a transistor including silicon. Note that the transistor Tr1a is not limited to a transistor including silicon. The threshold voltage of the transistor Tr1a is denoted by Vth1a.

A transistor Tr2a which is an n-channel transistor may be, for example, the transistor including an oxide semiconductor film, which is described in the above embodiment. The threshold voltage of the transistor Tr2a is denoted by Vth2a.

Here, a gate of the transistor Tr1a is connected to an input terminal Vin and a gate of the transistor Tr2a. A source of the transistor Tr1a is electrically connected to a power supply potential (VDD). A drain of the transistor Tr1a is connected to a drain of the transistor Tr2a and an output terminal Vout. A source of the transistor Tr2a is connected to a ground potential (GND). A back gate of the transistor Tr2a is connected to a back gate line BGL. In this embodiment, the transistor Tr2a has a back gate; however, one embodiment of the present invention is not limited thereto. For example, it is also possible to employ a structure in which the transistor Tr2a does not have a back gate or a structure in which the transistor Tr1a has a back gate.

For example, the threshold voltage Vth1a of the transistor Tr1a is higher than VDD with an inverted sign and lower than 0 V (−VDD<Vth1a<0 V). Further, the threshold voltage Vth2a of the transistor Tr2a is higher than 0 V and lower than VDD (0 V<Vth2a<VDD). Note that a back gate may be used for control of the threshold voltage of each transistor.

Here, when the potential of the input terminal Vin is set to VDD, the gate voltage of the transistor Tr1a becomes 0 V, so that the transistor Tr1a is turned off. Further, the gate voltage of the transistor Tr2a becomes VDD, so that the transistor Tr2a is turned on. Accordingly, the output terminal Vout is electrically connected to GND and supplied with GND.

When the potential of the input terminal Vin is set to GND, the gate voltage of the transistor Tr1a becomes VDD, so that the transistor Tr1a is turned on. Further, the gate voltage of the transistor Tr2a becomes 0 V, so that the transistor Tr2a is turned off. Accordingly, the output terminal Vout is electrically connected to VDD and supplied with VDD.

As described above, in the circuit diagram of FIG. 11A, GND is output from the output terminal Vout when the potential of the input terminal Vin is VDD, and VDD is output from the output terminal Vout when the potential of the input terminal Vin is GND.

Figure 11B:
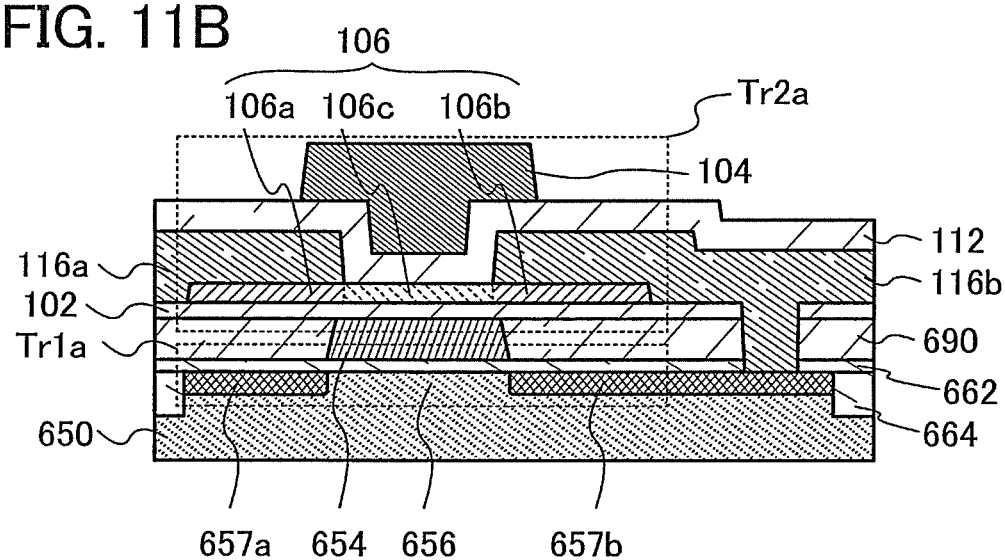

FIG. 11B is an example of a cross-sectional view of a semiconductor device corresponding to FIG. 11A.

FIG. 11B is a cross-sectional view of the semiconductor device including the transistor Tr1a over the transistor Tr1a, and the transistor Tr2a over the transistor Tr1a.

In FIG. 11B, a transistor similar to the transistor illustrated in FIGS. 1A to 1C is used as the transistor Tr2a. Therefore, for components of the transistor Tr2a which are not particularly described below, refer to the description on FIGS. 1A to 1C.

Here, the transistor Tr1a includes a semiconductor substrate 650, a channel region 656, a source region 657a, and a drain region 657b which are provided in the semiconductor substrate 650, an element isolation layer 664 which fills a groove portion provided in the semiconductor substrate 650, a gate insulating film 662 provided over the semiconductor substrate 650, and a gate electrode 654 provided over the channel region 656 with the gate insulating film 662 therebetween.

A single crystal semiconductor substrate or a polycrystalline semiconductor substrate of silicon, silicon carbide, or the like or a compound semiconductor substrate of silicon germanium or the like may be used as the semiconductor substrate 650.

In this embodiment, the transistor Tr1a is provided in a semiconductor substrate; however, one embodiment of the present invention is not limited thereto. For example, a structure may be employed in which a substrate having an insulating surface is used instead of the semiconductor substrate and a semiconductor film is provided on the insulating surface. Here, a glass substrate, a ceramic substrate, a quartz substrate, or a sapphire substrate may be used as the substrate having an insulating surface, for example.

The source region 657a and the drain region 657b include an impurity which makes the semiconductor substrate 650 have p-type conductivity.

The element isolation layer 664 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The gate insulating film 662 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The gate electrode 654 may be formed of a conductive film of a single layer or a stacked layer of a simple substance selected from aluminum, titanium, chromium, cobalt, nickel, copper, yttrium, zirconium, molybdenum, silver, tantalum, and tungsten; a nitride containing one or more kinds of the above substances; an oxide containing one or more kinds of the above substances; or an alloy containing one or more kinds of the above substances.

The gate electrode 654 functions not only as the gate electrode of the transistor Tr1a, but also as the gate electrode of the transistor Tr2a. Accordingly, the base insulating film 102 functions as the gate insulating film of the transistor Tr2a.

For a gate electrode 104 of the transistor Tr2a, refer to the description of the gate electrode 104 of the transistor illustrated in FIGS. 1A to 1C. Note that the gate electrode 104 functions as a back gate electrode of the transistor Tr2a.

In the semiconductor device illustrated in FIG. 11B, an insulating film 690 whose top surface is aligned with the top surface of the gate electrode 654 is provided. Note that a structure without the insulating film 690 may be employed.

The insulating film 690 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

An opening reaching the drain region 657b of the transistor Tr1a is provided in the gate insulating film 662, the insulating film 690, and the base insulating film 102. The drain electrode 116b of the transistor Tr2a is in contact with the drain region 657b of the transistor Tr1a through the opening.

By applying the transistor described in the above embodiment to the transistor Tr2a, a flow-through current when the transistor Tr2a is off can be significantly reduced because the transistor Tr2a has an extremely low off-state current. Thus, an inverter with low power consumption is achieved.

Figure 12A:
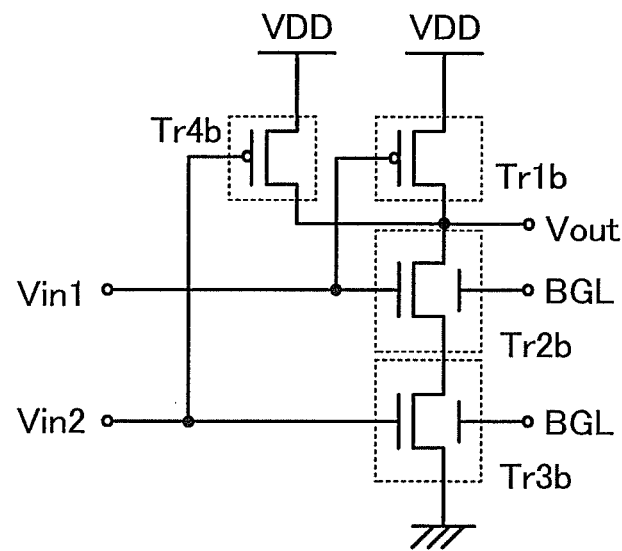
FIGS. 12A and 12B are circuit diagrams of semiconductor devices of one embodiment of the present invention.

Note that the inverters illustrated in FIG. 11A may be combined to form a NAND circuit illustrated in FIG. 12A. The circuit diagram of FIG. 12A includes a transistor Tr1b and a transistor Tr4b which are p-channel transistors, and a transistor Tr2b and a transistor Tr3b which are n-channel transistors. The transistors Tr1b and Tr4b may each be, for example, a transistor including silicon. The transistors Tr2b and Tr3b may each be the transistor including an oxide semiconductor film described in the above embodiment.

Figure 12B:
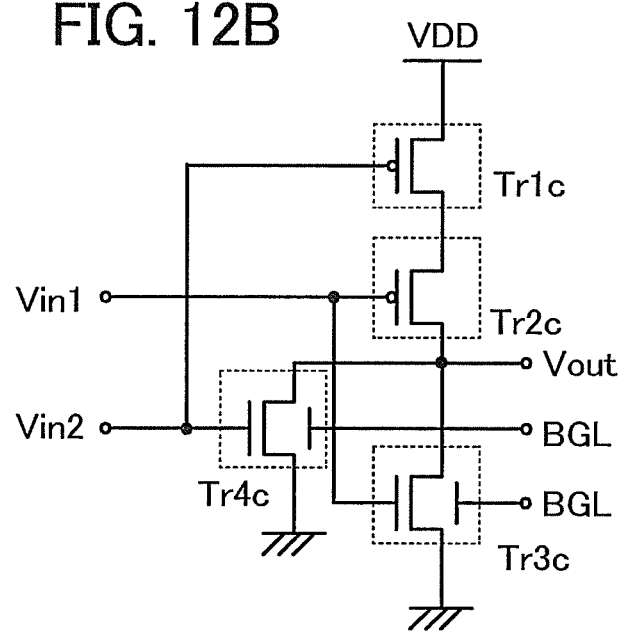

The inverter illustrated in FIG. 11A may be combined to form a NOR circuit illustrated in FIG. 12B. The circuit diagram of FIG. 12B includes a transistor Tr1c and a transistor Tr2c which are p-channel transistors, and a transistor Tr3c and a transistor Tr4c which are n-channel transistors. The transistors Tr1c and Tr2c may each be, for example, a transistor including silicon. The transistors Tr3c and Tr4c may each be the transistor including an oxide semiconductor film described in the above embodiment.

Figure 13A:
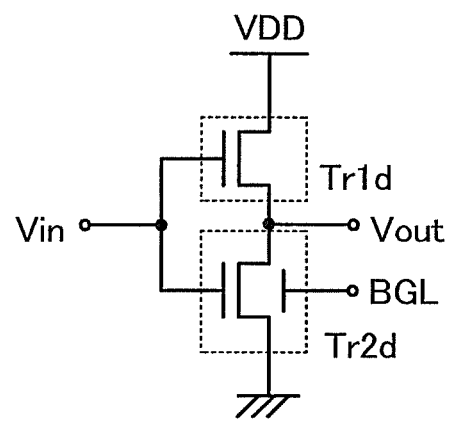
FIGS. 13A and 13B are a circuit diagram and a cross-sectional view of a semiconductor device of one embodiment of the present invention.

The aforementioned examples of logic circuits are configured with the inverters using p-channel transistors and n-channel transistors; a logic circuit may be configured with an inverter using only n-channel transistors. FIG. 13A illustrates an example of such a case.

The circuit diagram of FIG. 13A includes a transistor Tr1d which is a depletion transistor and a transistor Tr2d which is an enhancement transistor.

The depletion transistor Tr1d may be, for example, a transistor including an oxide semiconductor film. Note that the transistor Tr1d is not limited to a transistor including an oxide semiconductor film, and may be, for example, a transistor including silicon. The threshold voltage of the transistor Tr1d is denoted by Vth1d. A resistor with a sufficiently low resistance may be provided instead of the depletion transistor.

The enhancement transistor Tr2d may be, for example, the transistor including an oxide semiconductor film described in the above embodiment. The threshold voltage of the transistor Tr2d is denoted by Vth2d.

Note that the transistor including an oxide semiconductor film described in the above embodiment may be used as the transistor Tr1d. In that case, a transistor other than the transistor including an oxide semiconductor film described in the above embodiment may be used as the transistor Tr2d.

Here, a gate of the transistor Tr1d is connected to an input terminal Vin and a gate of the transistor Tr2d. A drain of the transistor Tr1d is electrically connected to VDD. A source of the transistor Tr1d is connected to a drain of the transistor Tr2d and an output terminal Vout. A source of the transistor Tr2d is connected to GND. A back gate of the transistor Tr2d is connected to a back gate line BGL. In this embodiment, the transistor Tr2d has a back gate; however, one embodiment of the present invention is not limited thereto. For example, it is also possible to employ a structure in which the transistor Tr2d does not have a back gate or a structure in which the transistor Tr1d has a back gate.

The threshold voltage Vth1d of the transistor Tr1d is, for example, lower than 0 V (Vth1d<0 V). Accordingly, the transistor Tr1d is on regardless of the gate voltage, that is, the transistor Tr1d functions as a resistor having a sufficiently low resistance. Further, the threshold voltage Vth2d of the transistor Tr2d is higher than 0 V and lower than VDD (0 V<Vth2d<VDD). Note that a back gate may be used for control of the threshold voltage of each transistor. Further, a resistor having a sufficiently low resistance may be provided instead of the transistor Tr1d.

Here, when the potential of the input terminal Vin is set to VDD, the gate voltage of the transistor Tr2d becomes VDD, so that the transistor Tr2d is turned on. Accordingly, the output terminal Vout is electrically connected to GND and supplied with GND.

Further, when the potential of the input terminal Vin is set to GND, the gate voltage of the transistor Tr2d becomes 0 V, so that the transistor Tr2d is turned off. Accordingly, the output terminal Vout is electrically connected to VDD and supplied with VDD. Note that strictly, the potential output from the output terminal Vout is equal to a potential dropped from VDD by the resistance of the transistor Tr1d. However, the effect of the voltage drop can be ignored because the resistance of the transistor Tr1d is sufficiently low.

As described above, in the circuit diagram of FIG. 13A, when the potential of the input terminal Vin is VDD, GND is output from the output terminal Vout, and when the potential of the input terminal Vin is GND, VDD is output from the output terminal Vout.

Note that the transistor Tr1d and the transistor Tr2d may be manufactured in the same plane, which facilitates the production of the inverter. At this time, a back gate is preferably provided in at least one of the transistors Tr1d and Tr2d. In the case where the manufactured transistors are depletion transistors, the threshold voltage Vth2d may be set within the above range by the back gate of the transistor Tr2d. In the case where the manufactured transistors are enhancement transistors, the threshold voltage Vth1d may be set within the above range by the back gate of the transistor Tr1d. Note that the threshold voltages of the transistors Tr1d and Tr2d may be controlled by different back gates.

Alternatively, the transistor Tr1d and the transistor Tr2d may overlap with each other, in which case the inverter can be reduced in area.

Figure 13B:
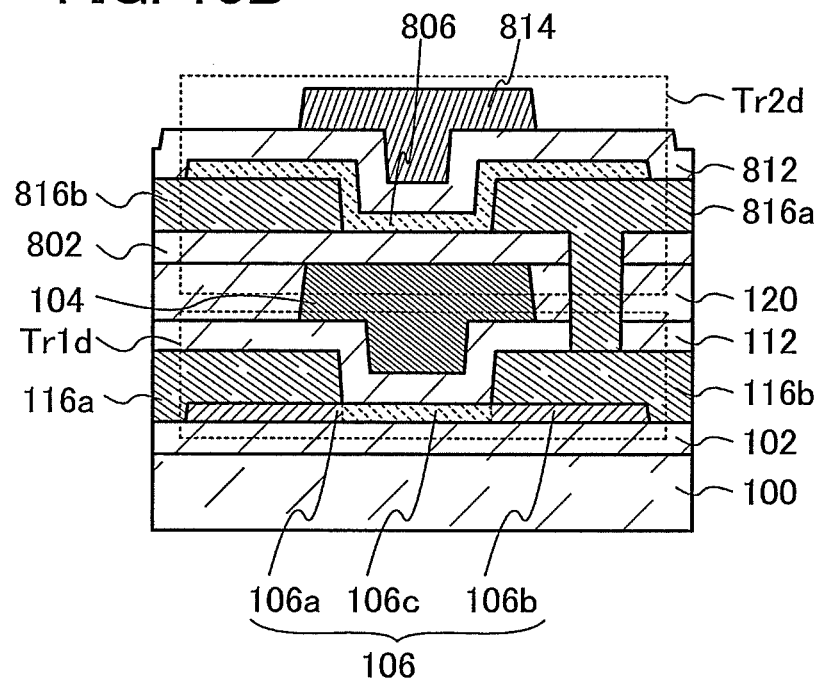

FIG. 13B is an example of a cross-sectional view of a semiconductor device in which the transistor Tr1d and the transistor Tr2d overlap with each other.

For the transistor Tr1d in FIG. 13B, refer to the description of the transistor illustrated in FIGS. 1A to 1C. Further the transistor Tr2d is different from the transistor illustrated in FIGS. 1A to 1C in that positions where the oxide semiconductor film is in contact with the source electrode and the drain electrode. Thus, for components of the transistor Tr2d which are not particularly described below, refer to the description on FIGS. 1A to 1C.

Note that the transistor Tr2d includes an insulating film 802 over the transistor Tr1d; a source electrode 816a and a drain electrode 816b over the insulating film 802; an oxide semiconductor film 806 over the insulating film 802, the source electrode 816a, and the drain electrode 816b; a gate insulating film 812 over the oxide semiconductor film 806; and a gate electrode 814 which is over the gate insulating film 812 and overlaps with the oxide semiconductor film 806.

The gate electrode 104 functions not only as the gate electrode of the transistor Tr1d, but also as the gate electrode of the transistor Tr2d. Accordingly, the insulating film 802 functions as the gate insulating film of the transistor Tr2d.

For the source electrode 816a and the drain electrode 816b of the transistor Tr2d, refer to the description of the source electrode 116a and the drain electrode 116b of the transistor illustrated in FIGS. 1A to 1C.

For the oxide semiconductor film 806 of the transistor Tr2d, refer to the description of the oxide semiconductor film 106 of the transistor illustrated in FIGS. 1A to 1C.

For the gate insulating film 812 of the transistor Tr2d, refer to the description of the gate insulating film 112 of the transistor illustrated in FIGS. 1A to 1C.

For a gate electrode 814 of the transistor Tr2d, refer to the description of the gate electrode 104 of the transistor illustrated in FIGS. 1A to 1C. Note that the gate electrode 814 functions as a back gate electrode of the transistor Tr2d.

In the semiconductor device illustrated in FIG. 13B, the insulating film 120 whose top surface is aligned with the top surface of the gate electrode 104 is provided. Note that a structure without the insulating film 120 may be employed.

The insulating film 120 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

An opening reaching the drain electrode 116b of the transistor Tr1d is formed in the gate insulating film 112, the insulating film 120, and the insulating film 802. The source electrode 816a of the transistor Tr2d is in contact with the drain electrode 116b of the transistor Tr1d through the opening.

By applying the transistor described in the above embodiment to the transistor Tr1d, a flow-through current when the transistor Tr1d is off can be significantly reduced because the transistor Tr1d has an extremely low off-state current. Thus, an inverter with low power consumption is achieved.

This embodiment can be implemented in appropriate combination with any of the other embodiments and examples.

(Embodiment 5)

In this embodiment, a static random access memory (SRAM) will be described, the SRAM being a semiconductor device including a flip-flop which is obtained by applying the inverter circuit shown in Embodiment 4.

In the SRAM, data is retained using a flip-flop; therefore, unlike in a dynamic random access memory (DRAM), refresh operation is not necessary and thus data can be retained with less power. In addition, the SRAM does not use a capacitor and thus is suitable for application requiring high-speed operation.

Figure 14:
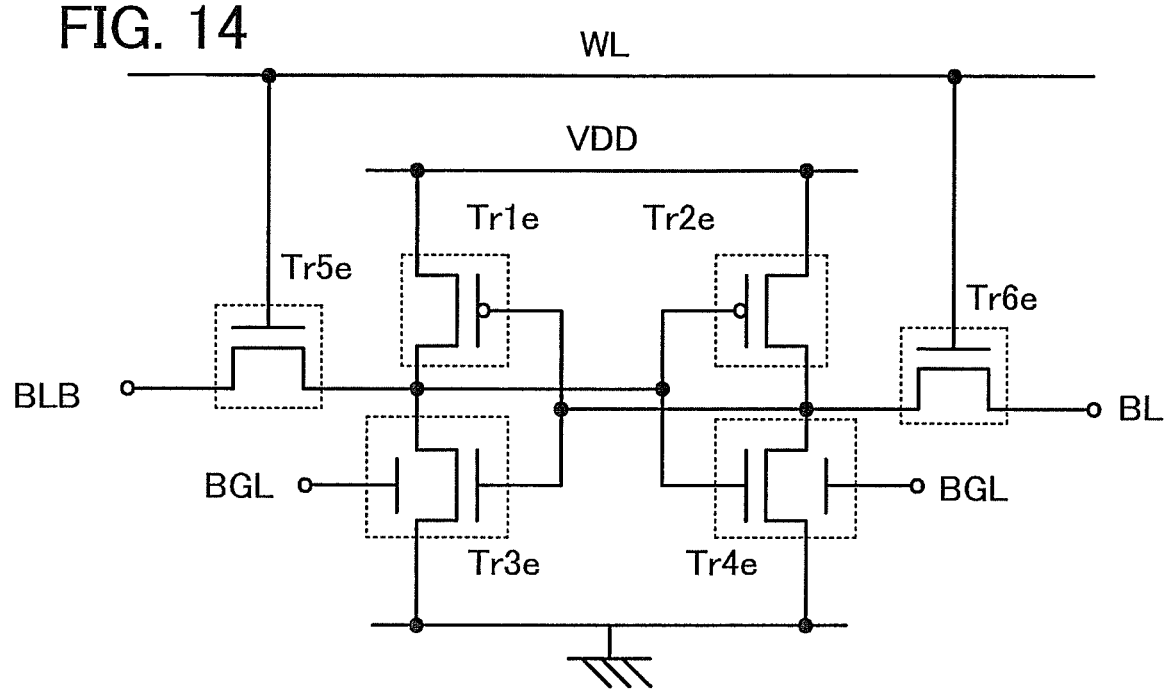
FIG. 14 is a circuit diagram of a semiconductor device of one embodiment of the present invention.

FIG. 14 is a circuit diagram equivalent to a memory cell of an SRAM of one embodiment of the present invention. Although only one memory cell is illustrated in FIG. 14, one embodiment of the present invention may be applied to a memory cell array including a plurality of the memory cells.

The memory cell illustrated in FIG. 14 includes a transistor Tr1e, a transistor Tr2e, a transistor Tr3e, a transistor Tr4e, a transistor Tr5e, and a transistor Tr6e. The transistors Tr1e and Tr2e are p-channel transistors, and the transistors Tr3e and Tr4e are n-channel transistors. A gate of the transistor Tr1e is electrically connected to a drain of the transistor Tr2e, a gate of the transistor Tr3e, a drain of the transistor Tr4e, and one of a source and a drain of the transistor Tr6e. A source of the transistor Tr1e is electrically connected to VDD. A drain of the transistor Tr1e is electrically connected to a gate of the transistor Tr2e, a drain of the transistor Tr3e, a gate of the transistor Tr4e, and one of a source and a drain of the transistor Tr5e. A source of the transistor Tr2e is electrically connected to VDD. A source of the transistor Tr3e is electrically connected to GND. A back gate of the transistor Tr3e is electrically connected to a back gate line BGL. A source of the transistor Tr4e is electrically connected to GND. A back gate of the transistor Tr4e is electrically connected to a back gate line BGL. A gate of the transistor Tr5e is electrically connected to the word line WL. The other of the source and the drain of the transistor Tr5e is electrically connected to a bit line BLB. A gate of the transistor Tr6e is electrically connected to the word line WL. The other of the source and the drain of the transistor Tr6e is electrically connected to a bit line BL.

Note that this embodiment shows an example where n-channel transistors are used as the transistors Tr5e and Tr6e. However, the transistors Tr5e and Tr6e are not limited to n-channel transistors and may be p-channel transistors. In that case, writing, retaining, and reading methods described below may be changed as appropriate.

A flip-flop is thus configured in such a manner that an inverter including the transistors Tr1e and Tr3e and an inverter including the transistors Tr2e and Tr4e are connected in a ring.

The p-channel transistors may be, but are not limited to, transistors including silicon for example. The n-channel transistors may each be the transistor including an oxide semiconductor film described in the above embodiment.

In this embodiment, the transistors Tr3e and Tr4e may each be the transistor including an oxide semiconductor film described in the above embodiment. With an extremely low off-state current, the transistor has an extremely low flow-through current.

Note that instead of the p-channel transistors, n-channel transistors may be applied to the transistors Tr1e and Tr2e. In the case where n-channel transistors are used as the transistors Tr1e and Tr2e, depletion transistors may be employed as described with reference to FIGS. 13A and 13B.

Writing, retaining, and reading operation of the memory cell illustrated in FIG. 14 will be described below.

In writing, first, potentials corresponding to data 0 or data 1 are applied to the bit line BL and the bit line BLB.

For example, in the case where data 1 is to be written, the VDD is applied to the bit line BL and the GND is applied to the bit line BLB. Then, a potential (VH) higher than or equal to the sum of the VDD and the threshold voltage of the transistors Tr5e and Tr6e is applied to the word line WL.

Next, the potential of the word line WL is set to be lower than the threshold voltage of the transistors Tr5e and Tr6e, whereby the data 1 written to the flip-flop is retained. In the case of the SRAM, a current flowing in retaining data is only the leakage current of the transistors. Here, any of the transistors including an oxide semiconductor film described in the above embodiment, which has an extremely low off-state current, is applied to some of the transistors in the SRAM, resulting in a reduction in stand-by power for retaining data because leakage current due to the transistor is extremely low.

In reading, the VDD is applied to the bit line BL and the bit line BLB in advance. Then, the VH is applied to the word line WL, so that the potential of the bit line BLB is discharged through the transistors Tr5e and Tr3e to be equal to the GND while the potential of the bit line BL is kept at VDD. The potential difference between the bit line BL and the bit line BLB is amplified by a sense amplifier (not illustrated), whereby the retained data 1 can be read.

In the case where data 0 is to be written, the GND is applied to the bit line BL and the VDD is applied to the bit line BLB; then, the VH is applied to the word line WL. Next, the potential of the word line WL is set to be lower than the threshold voltage of the transistors Tr5e and Tr6e, whereby the data 0 written to the flip-flop is retained. In reading, the VDD is applied to the bit line BL and the bit line BLB in advance. Then, the VH is applied to the word line WL, so that the potential of the bit line BL is discharged through the transistors Tr6e and Tr4e to be equal to the GND while the potential of the bit line BLB is kept at VDD. The potential difference between the bit line BL and the bit line BLB is amplified by the sense amplifier, whereby the retained data 0 can be read.

According to this embodiment, an SRAM with low standby power can be provided.

This embodiment can be implemented in appropriate combination with any of the other embodiments and examples.

(Embodiment 6)

The transistors including an oxide semiconductor film described in the above embodiment can have extremely low off-state current. That is, the transistor has electrical characteristics in which leakage of charge through the transistor is unlikely to occur.

A semiconductor device which includes a transistor having such electric characteristics will be described below. The semiconductor device includes a memory element which is functionally superior to a known memory element.

Figure 15A:
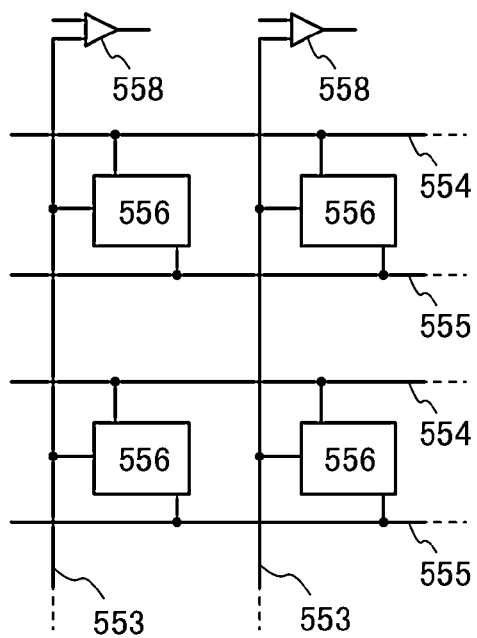
FIGS. 15A and 15B are circuit diagrams of a semiconductor device of one embodiment of the present invention.
Figure 15B:
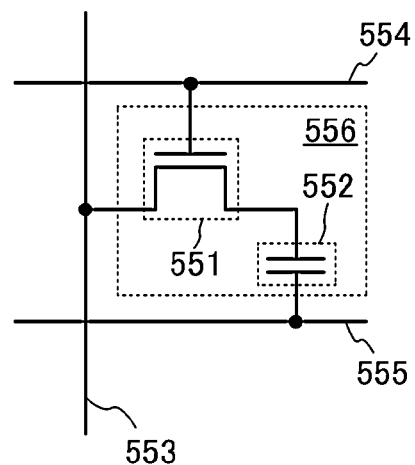
Figure 15C:
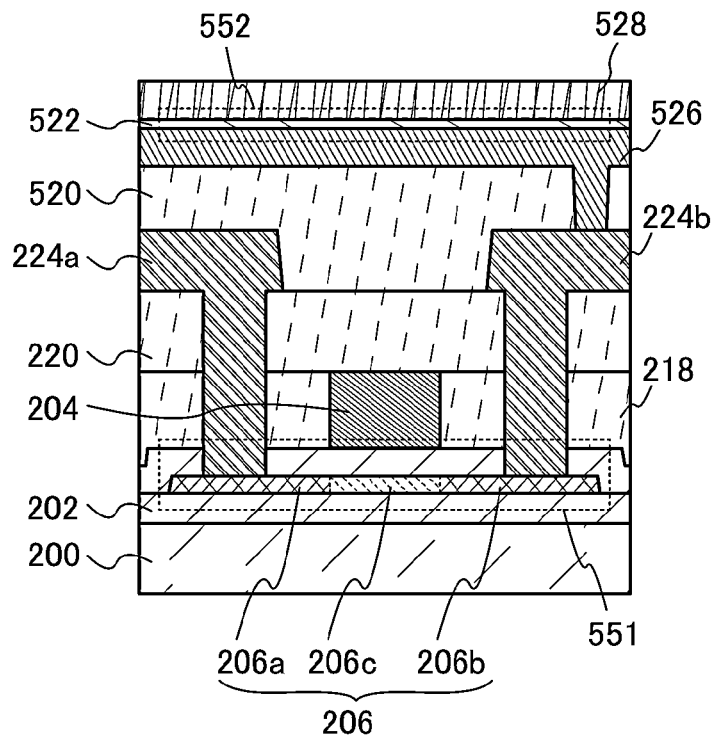
FIG. 15C is a cross-sectional view of the semiconductor device.
Figure 15D:
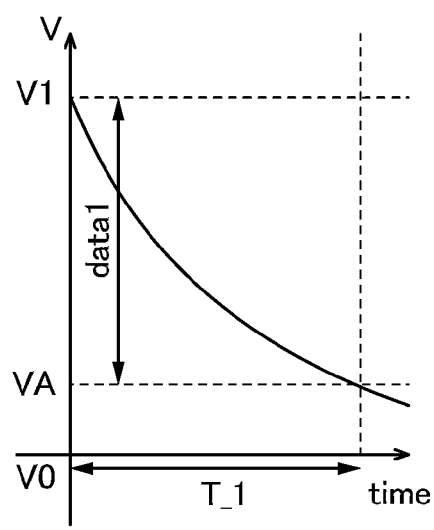
FIG. 15D is a graph showing electric characteristics of the semiconductor device.

First, the semiconductor device will be specifically described with reference to FIGS. 15A to 15D. FIG. 15A is a circuit diagram showing a memory cell array of the semiconductor device. FIG. 15B is a circuit diagram of a memory cell. FIG. 15C illustrates an example of a cross-sectional structure corresponding to the memory cell in FIG. 15B. FIG. 15D is a graph showing the electric characteristics of the memory cell in FIG. 15B.

The memory cell array in FIG. 15A includes a plurality of memory cells 556, a plurality of bit lines 553, a plurality of word lines 554, a plurality of capacitor lines 555, and a plurality of sense amplifiers 558.

Note that the bit lines 553 and the word lines 554 are provided in a grid pattern, and the memory cell 556 is provided for each intersection of the bit line 553 and the word line 554. The bit lines 553 are connected to the respective sense amplifiers 558. The sense amplifiers 558 have a function of reading the potentials of the bit lines 553 as data.

As shown in FIG. 15B, the memory cell 556 includes a transistor 551 and a capacitor 552. A gate of the transistor 551 is electrically connected to the word line 554. A source of the transistor 551 is electrically connected to the bit line 553. A drain of the transistor 551 is electrically connected to one terminal of the capacitor 552. The other terminal of the capacitor 552 is electrically connected to the capacitor line 555.

FIG. 15C illustrates an example of a cross-sectional structure of the memory cell. FIG. 15C is a cross-sectional view of the semiconductor device including the transistor 551, the wirings 224a and 224b connected to the transistor 551, an insulating film 520 over the transistor 551 and the wirings 224a and 224b, and the capacitor 552 over the insulating film 520.

Note that in FIG. 15C, the transistor illustrated in FIGS. 4A to 4C is used as the transistor 551. Therefore, for components of the transistor 551 which are not particularly described below, refer to the description in the above embodiment.

The insulating film 520 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, a resin film of a polyimide resin, an acrylic resin, an epoxy resin, a silicone resin, or the like may be used as the insulating film 520.

The capacitor 552 includes an electrode 526 in contact with the wiring 224b, an electrode 528 overlapping with the electrode 526, and an insulating film 522 provided between the electrode 526 and the electrode 528.

The electrode 526 may be formed of a single layer or a stacked layer of a conductive film of a simple substance selected from aluminum, titanium, chromium, cobalt, nickel, copper, yttrium, zirconium, molybdenum, silver, tantalum, and tungsten; a nitride containing one or more kinds of the above substances; an oxide containing one or more kinds of the above substances; or an alloy containing one or more kinds of the above substances.

The electrode 528 may be formed of a single layer or a stacked layer of a conductive film of a simple substance selected from aluminum, titanium, chromium, cobalt, nickel, copper, yttrium, zirconium, molybdenum, silver, tantalum, and tungsten; a nitride containing one or more kinds of the above substances; an oxide containing one or more kinds of the above substances; or an alloy containing one or more kinds of the above substances.

The insulating film 522 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

Note that although FIG. 15C shows an example where the transistor 551 and the capacitor 552 are provided in different layers, one embodiment of the present invention is not limited to this structure. For example, the transistor 551 and the capacitor 552 may be provided in the same plane. With such a structure, memory cells having similar structures can be disposed so as to overlap with each other, in which case, a large number of memory cells can be integrated in an area for one memory cell. Accordingly, the degree of integration of the semiconductor device can be improved. Note that in this specification, "A overlaps with B" means that A and B are provided such that at least part of A overlaps with at least part of B.

Here, the wiring 224a in FIG. 15C is electrically connected to the bit line 553 in FIG. 15B. The gate electrode 204 in FIG. 15C is electrically connected to the word line 554 in FIG. 15B. The electrode 528 in FIG. 15C is electrically connected to the capacitor line 555 in FIG. 15B.

As shown in FIG. 15D, a voltage held in the capacitor 552 gradually decreases with time due to leakage through the transistor 551. A voltage originally charged from V0 to V1 is decreased with time to VA that is a limit for reading out data 1. This period is called a holding period T_1. In the case of a two-level memory cell, refresh operation needs to be performed within the holding period T_1.

For example, in the case where the off-state current of the transistor 551 is not sufficiently small, the holding period T_1 becomes short because the voltage held in the capacitor 552 significantly changes with time. Accordingly, refresh operation needs to be frequently performed. An increase in frequency of refresh operation increases power consumption of the semiconductor device.

Since the off-state current of the transistor 551 is extremely small in this embodiment, the holding period T_1 can be made extremely long. Further, the frequency of refresh operation can be reduced; thus, power consumption can be reduced. For example, in the case where a memory cell is formed using the transistor 551 having an off-state current of $1 \times 10^{-21}$ A to $1\times10^{-25}$ A, data can be held for several days to several decades without supply of electric power.

As described above, according to one embodiment of the present invention, a semiconductor device with high degree of integration and low power consumption can be provided.

Figure 16A:
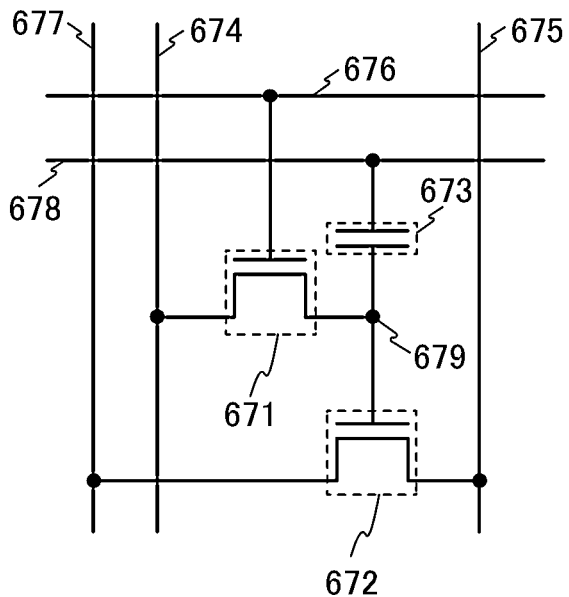
FIG. 16A is a circuit diagram of a semiconductor device of one embodiment of the present invention.
Figure 16B:
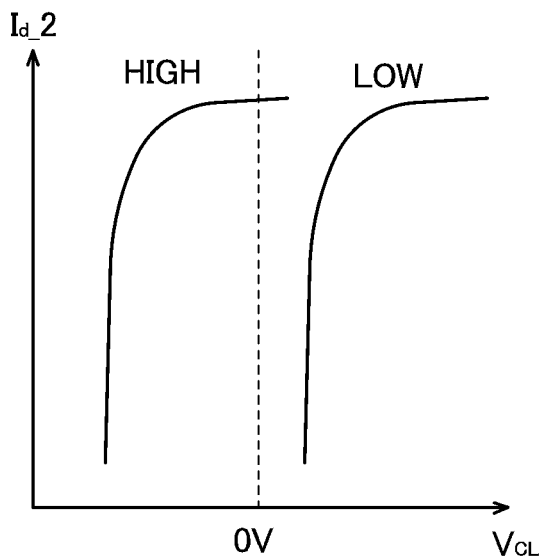
FIG. 16B is a graph showing electric characteristics of the semiconductor device.
Figure 16C:
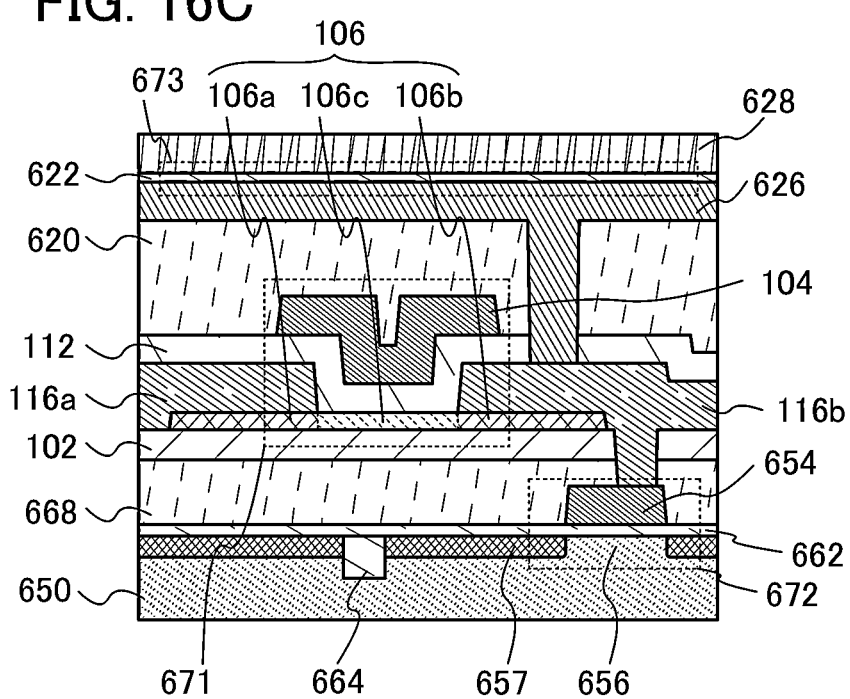
FIG. 16C is a cross-sectional view of the semiconductor device.

Next, a semiconductor device having a structure different from that of the semiconductor device in FIGS. 15A to 15D is described with reference to FIGS. 16A to 16C. FIG. 16A is a circuit diagram showing a memory cell and wirings included in the semiconductor device. FIG. 16B is a graph showing the electric characteristics of the memory cell in FIG. 16A. FIG. 16C is an example of a cross-sectional view corresponding to the memory cell in FIG. 16A.

As shown in FIG. 16A, the memory cell includes a transistor 671, a transistor 672, and a capacitor 673. Here, a gate of the transistor 671 is electrically connected to a word line 676. A source of the transistor 671 is electrically connected to a source line 674. A drain of the transistor 671 is electrically connected to a gate of the transistor 672 and one terminal of the capacitor 673. A portion where the drain of the transistor 671 is electrically connected to the gate of the transistor 672 and the one terminal of the capacitor 673 is referred to as a node 679. A source of the transistor 672 is electrically connected to a source line 675. A drain of the transistor 672 is electrically connected to a drain line 677. The other terminal of the capacitor 673 is electrically connected to a capacitor line 678.

The semiconductor device illustrated in FIGS. 16A to 16C utilizes variation in the apparent threshold voltage of the transistor 672, which depends on the potential of the node 679. For example, FIG. 16B shows a relation between a voltage $V_{CL}$ of the capacitor line 678 and a drain current $I_{d\_}2$ flowing through the transistor 672.

The potential of the node 679 can be controlled through the transistor 671. For example, the potential of the source line 674 is set to a power supply potential VDD. In this case, when the potential of the word line 676 is set to be higher than or equal to a potential obtained by adding the power supply potential VDD to the threshold voltage Vth of the transistor 671, the potential of the node 679 can be HIGH. Further, when the potential of the word line 676 is set to be lower than or equal to the threshold voltage Vth of the transistor 671, the potential of the node 679 can be LOW.

Thus, the transistor 672 has electric characteristics shown with either a $V_{CL}$-$I_{d\_}2$ curve denoted as LOW or a $V_{CL}$-$I_{d\_}2$ curve denoted as HIGH. That is, when the potential of the node 679 is LOW, $I_{d\_}2$ is small at a $V_{CL}$ of 0 V; accordingly, data 0 is stored. Further, when the potential of the node 679 is HIGH, $I_{d\_}2$ is large at a $V_{CL}$ of 0 V; accordingly, data 1 is stored. In this manner, data can be stored.

FIG. 16C illustrates an example of a cross-sectional structure of the memory cell. FIG. 16C is a cross-sectional view of the semiconductor device including the transistor 672, an insulating film 668 over the transistor 672, the transistor 671 over the insulating film 668, an insulating film 620 over the transistor 671, and the capacitor 673 over the insulating film 620.

The insulating film 620 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, a resin film of a polyimide resin, an acrylic resin, an epoxy resin, a silicone resin, or the like may be used as the insulating film 620.

Note that in FIG. 16C, the transistor illustrated in FIGS. 1A to 1C is used as the transistor 671. Therefore, for components of the transistor 671 which are not particularly described below, refer to the description in the above embodiment.

The transistor including crystalline silicon has an advantage that on-state characteristics can be improved more easily than a transistor including an oxide semiconductor film. Therefore, it can be said that the transistor including crystalline silicon is suitable for the transistor 672 for which excellent on-state characteristics are required.

Here, the transistor 672 includes the channel region 656 and impurity regions 657 which are provided in the semiconductor substrate 650, the element isolation layer 664 which fills a groove portion provided in the semiconductor substrate 650, the gate insulating film 662 provided over the semiconductor substrate 650, and the gate electrode 654 provided over the channel region 656 with the gate insulating film 662 therebetween. For the transistor 672, refer to the description of the transistor Tr1a illustrated in FIG. 11B.

The gate insulating film 668 may be formed of a single layer or a stacked layer using an insulating film containing one or more of aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

The insulating film 668 and the base insulating film 102 include an opening reaching the gate electrode 654 of the transistor 672. The drain electrode 116b of the transistor 671 is in contact with the gate electrode 654 of the transistor 672 through the opening.

The capacitor 673 includes an electrode 626 in contact with the drain electrode 116b, an electrode 628 overlapping with the electrode 626, and an insulating film 622 provided between the electrode 626 and the electrode 628.

For the electrode 626, refer to the description of the electrode 526.

For the electrode 628, refer to the description of the electrode 528.

Here, the source electrode 116a in FIG. 16C is electrically connected to the source line 674 in FIG. 16A. The gate electrode 404 in FIG. 16C is electrically connected to the word line 676 in FIG. 16A. Further, the electrode 628 in FIG. 16C is electrically connected to the capacitor line 678 in FIG. 16A.

Note that although FIG. 16C shows an example where the transistor 671 and the capacitor 673 are provided in different layers, one embodiment of the present invention is not limited to this structure. For example, the transistor 671 and the capacitor 673 may be provided in the same plane. With such a structure, memory cells having similar structures can be disposed so as to overlap with each other, in which case, a large number of memory cells can be integrated in an area for one memory cell. Accordingly, the degree of integration of the semiconductor device can be improved.

Here, when any of the transistors including an oxide semiconductor film described in the above embodiment is used as the transistor 671, charge accumulated in the node 679 can be prevented from leaking through the transistor 671 because the off-state current of the transistor is extremely small. Therefore, data can be held for a long period. Further, a voltage necessary for writing data does not need to be high as compared to the case of a flash memory; thus, power consumption can be made lower and operation speed can be made higher.

As described above, according to one embodiment of the present invention, a semiconductor device with high degree of integration and low power consumption can be provided.

This embodiment can be implemented in appropriate combination with any of the other embodiments and examples.

(Embodiment 7)

A central processing unit (CPU) can be formed with the use of any of the transistors including an oxide semiconductor film described in the above embodiment or any of the semiconductor devices including a memory element described in the above embodiment for at least part of the CPU.

Figure 17A:
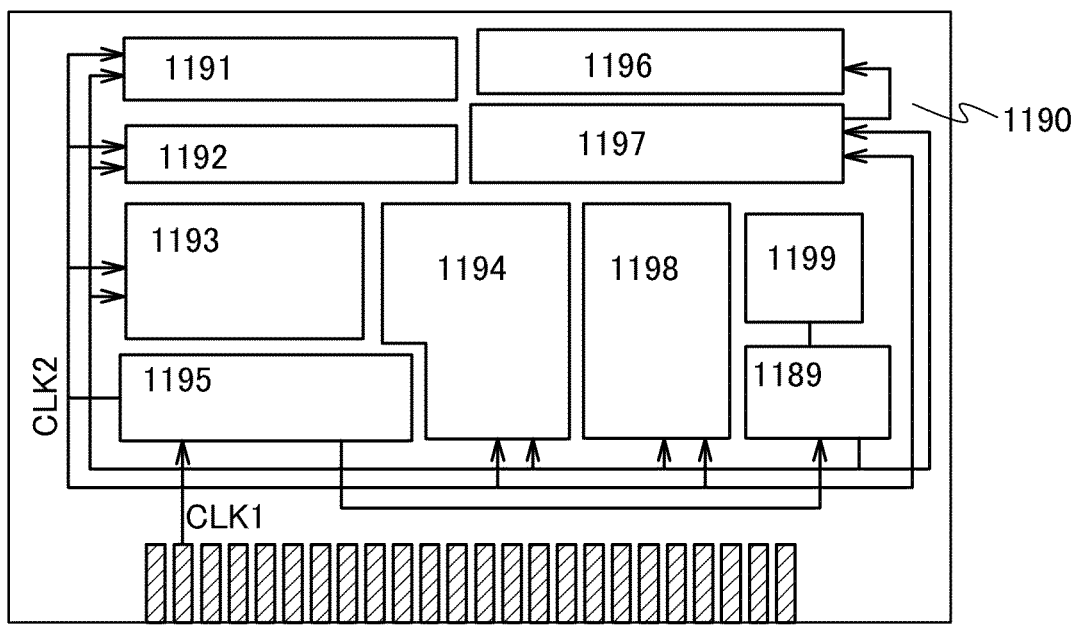
FIGS. 17A to 17C are block diagrams illustrating structures of a CPU of one embodiment of the present invention.

FIG. 17A is a block diagram illustrating a specific structure of a CPU. The CPU illustrated in FIG. 17A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 17A is just an example in which the configuration is simplified, and actual CPUs may have a variety of configurations depending on the application.

An instruction input to the CPU through the bus interface 1198 is input to the instruction decoder 1193, decoded therein, and then input to the ALU controller 1192, the interrupt controller 1194, the register controller 1197, and the timing controller 1195.

The ALU controller 1192, the interrupt controller 1194, the register controller 1197, and the timing controller 1195 conduct a variety of controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit on the basis of its priority or a mask state. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 17A, a memory element is provided in the register 1196. For the register 1196, any of the semiconductor devices including a memory element described in the above embodiment can be used.

In the CPU illustrated in FIG. 17A, the register controller 1197 selects operation of retaining data in the register 1196 in accordance with an instruction from the ALU 1191. That is, the register controller 1197 selects whether data is retained by a flip flop or a capacitor in the memory element included in the register 1196. When data is retained by the flip flop, a power supply voltage is supplied to the memory element in the register 1196. When data is retained by the capacitor, the data in the capacitor is rewritten, and supply of the power supply voltage to the memory element in the register 1196 can be stopped.

Figure 17B:
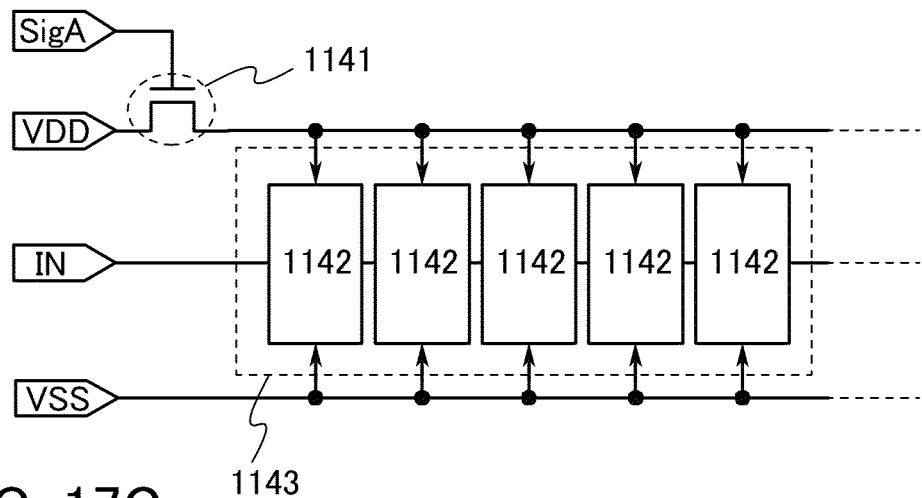
Figure 17C:
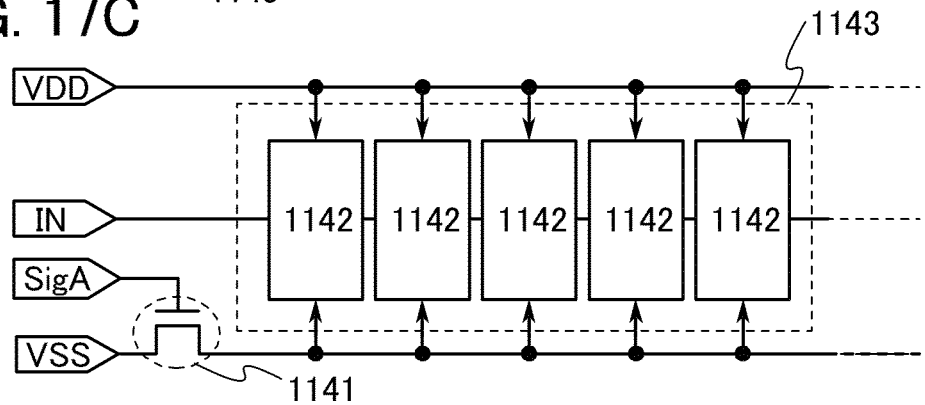

A switching element provided between a memory element group and a node to which a power supply potential VDD or a power supply potential VSS is supplied, as illustrated in FIG. 17B or FIG. 17C, allows the power supply to be stopped. Circuits illustrated in FIGS. 17B and 17C are described below.

FIGS. 17B and 17C each illustrate an example of a structure including any of the transistors including an oxide semiconductor film described in the above embodiment as a switching element for controlling supply of a power supply potential to a memory element.

The memory device illustrated in FIG. 17B includes a switching element 1141 and a memory element group 1143 including a plurality of memory elements 1142. Specifically, as each of the memory elements 1142, any of the semiconductor devices including a memory element described in the above embodiment can be used. Each of the memory elements 1142 included in the memory element group 1143 is supplied with the high-level power supply potential VDD through the switching element 1141. Further, each of the memory elements 1142 included in the memory element group 1143 is supplied with a potential of a signal IN and the low-level power supply potential VSS.

In FIG. 17B, as the switching element 1141, any of the transistors including an oxide semiconductor film described in the above embodiment is used. The transistors can have extremely low off-state current. The switching of the transistor is controlled by a signal SigA input to a gate thereof.

Note that FIG. 17B illustrates the structure in which the switching element 1141 includes only one transistor; however, one embodiment of the present invention is not limited thereto. The switching element 1141 may include a plurality of transistors. In the case where the switching element 1141 includes a plurality of transistors functioning as switching elements, the plurality of transistors may be connected to each other in parallel, in series, or in combination of parallel connection and series connection.

FIG. 17C shows an example of a memory device in which each of the memory elements 1142 included in the memory element group 1143 is supplied with the low-level power supply potential VSS through the switching element 1141. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be retained even in the case where an operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example here, the transistor and the semiconductor device can also be applied to an LSI such as a digital signal processor (DSP), a custom LSI, or a field programmable gate array (FPGA).

This embodiment can be implemented in appropriate combination with any of the other embodiments and examples.

(Embodiment 8)

In this embodiment, a display device to which any of the transistors described in the above embodiment is applied will be described.

As a display element provided in the display device, a liquid crystal element (also referred to as a liquid crystal display element), a light-emitting element (also referred to as a light-emitting display element), or the like can be used. A light-emitting element includes, in its category, an element whose luminance is controlled by current or voltage, and specifically an inorganic electroluminescent (EL) element, an organic EL element, and the like. Furthermore, a display medium whose contrast is changed by an electric effect, such as electronic ink, can be used as the display element. In this embodiment, a display device including an EL element and a display device including a liquid crystal element will be described as examples of the display device.

Note that the display device in this embodiment includes in its category a panel in which a display element is sealed, and a module in which an IC such as a controller is mounted on the panel.

Additionally, the display device in this embodiment refers to an image display device, a display device, or a light source (including a lighting device). The display device includes any of the following modules in its category: a module provided with a connector such as an FPC or TCP; a module in which a printed wiring board is provided at the end of TCP; and a module in which an integrated circuit (IC) is mounted directly on a display element by a COG method.

Figure 18A:
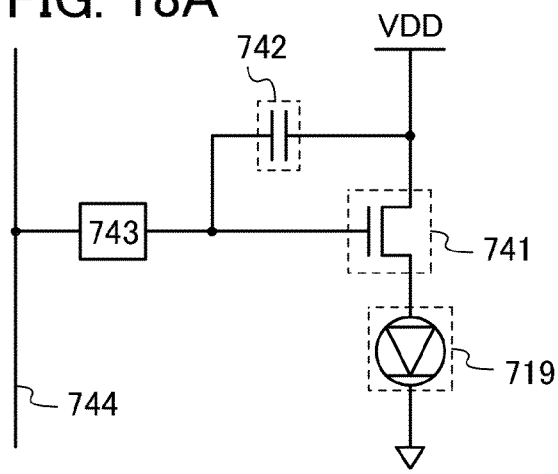
FIG. 18A is a circuit diagram of a display device including an EL element of one embodiment of the present invention.

FIG. 18A is an example of a circuit diagram of the display device including an EL element.

The display device illustrated in FIG. 18A includes a switching element 743, a transistor 741, a capacitor 742, and a light-emitting element 719.

A gate of the transistor 741 is electrically connected to one terminal of the switch element 743 and one terminal of the capacitor 742. A source of the transistor 741 is electrically connected to one terminal of the light-emitting element 719. A drain of the transistor 741 is electrically connected to the other terminal of the capacitor 742 and is supplied with a power supply potential VDD. The other terminal of the switch element 743 is electrically connected to a signal line 744. The other terminal of the light-emitting element 719 is supplied with a fixed potential. Note that the fixed potential is a ground potential GND or lower.

As the transistor 741, any of the transistors including an oxide semiconductor film described in the above embodiment is used. The transistor has favorable switching characteristics. Consequently, a display device having high display quality can be obtained.

As the switching element 743, it is preferred to use a transistor. With a transistor, the area of a pixel can be reduced, so that a display device having a high resolution can be obtained. Moreover, as the switching element 743, any of the transistors including an oxide semiconductor film described in the above embodiment may be used. With the use of the transistor as the switching element 743, the switching element 743 can be formed in the same process as the transistor 741; thus, the productivity of the display device can be improved.

Figure 18B:
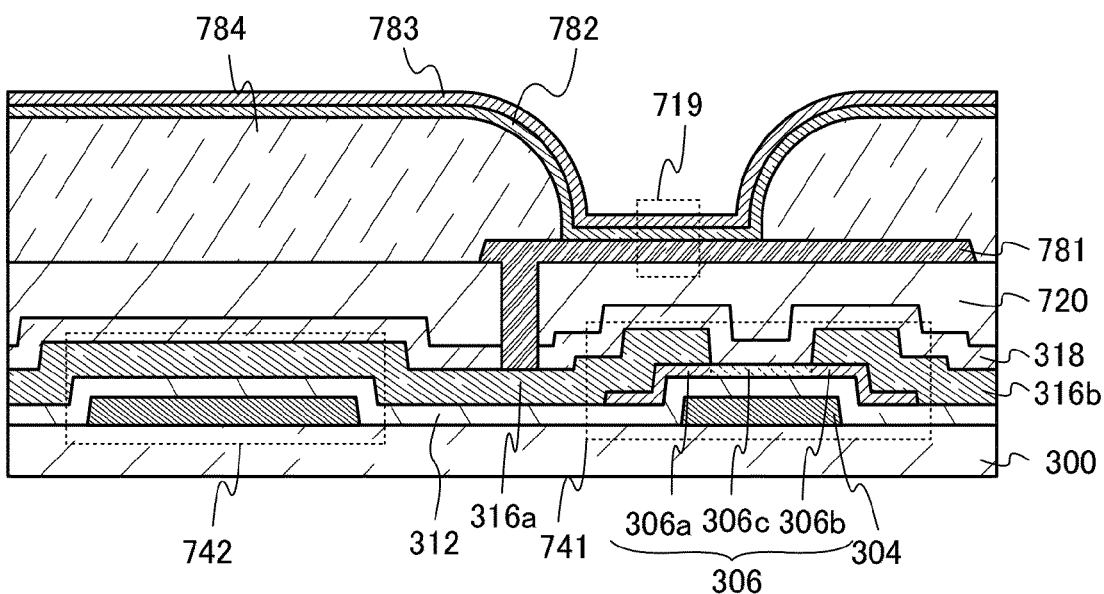
FIG. 18B is a cross-sectional view of part of a pixel of the display device.

FIG. 18B illustrates part of a cross section of a pixel including the transistor 741, the capacitor 742, and the light-emitting element 719.

Note that FIG. 18B shows an example where the transistor 741 and the capacitor 742 are provided in the same plane. With such a structure, the capacitor 742 can be formed in the same plane as a gate electrode, a gate insulating film, and a source electrode (drain electrode), which are included in the transistor 741. When the transistor 741 and the capacitor 742 are provided in the same plane in this manner, the number of manufacturing steps of the display device can be reduced; thus, the productivity can be increased.

In FIG. 18B, the transistor 741 has a structure in which a protective insulating film 318 is included in the transistor illustrated in FIGS. 8A to 8C. Thus, for components of the transistor 741 which are not particularly described below, refer to the description in the above embodiment. Note that for the protective insulating film 318, refer to the description of the base insulating film 102.

An insulating film 720 is provided over the transistor 741 and the capacitor 742.

Here, an opening reaching the source electrode 316a of the transistor 741 is provided in the insulating film 720 and the protective insulating film 318.

An electrode 781 is provided over the insulating film 720. The electrode 781 is connected to the source electrode 316a of the transistor 741 through the opening provided in the insulating film 720 and the protective insulating film 318.

A partition 784 having an opening reaching the electrode 781 is provided over the electrode 781.

A light-emitting layer 782 in contact with the electrode 781 through the opening provided in the partition 784 is provided over the partition 784.

An electrode 783 is provided over the light-emitting layer 782.

A region where the electrode 781, the light-emitting layer 782, and the electrode 783 overlap with one another serves as the light-emitting element 719.

The insulating film 720 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, a resin film of a polyimide resin, an acrylic resin, an epoxy resin, a silicone resin, or the like may be used.

Figure 18C:
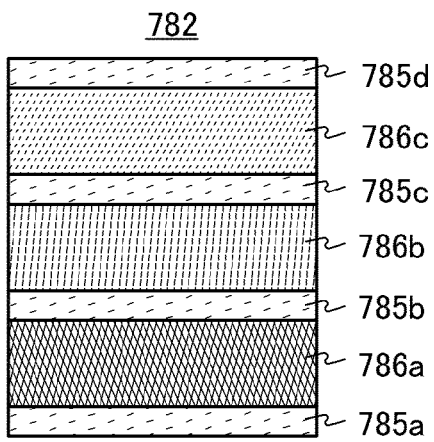
FIG. 18C is a cross-sectional view of a light-emitting layer in the display device.

The light-emitting layer 782 is not limited to a single layer, and may be a stack of plural kinds of light-emitting layers and the like. For example, a structure illustrated in FIG. 18C may be employed. FIG. 18C illustrates the structure in which an intermediate layer 785a, a light-emitting layer 786a, an intermediate layer 785b, a light-emitting layer 786b, an intermediate layer 785c, a light-emitting layer 786c, and an intermediate layer 785d are stacked in this order. In that case, when light-emitting layers emitting light of appropriate colors are used as the light-emitting layer 786a, the light-emitting layer 786b, and the light-emitting layer 786c, the light-emitting element 719 with a high color rendering property or higher luminous efficiency can be formed.

White light may be obtained by stacking plural kinds of light-emitting layers. Although not illustrated in FIG. 18B, white light may be extracted through coloring layers.

Although the structure in which three light-emitting layers and four intermediate layers are provided is shown here, the number of light-emitting layers and the number of intermediate layers can be changed as appropriate. For example, the light-emitting layer 782 can be formed with only the intermediate layer 785a, the light-emitting layer 786a, the intermediate layer 785b, the light-emitting layer 786b, and the intermediate layer 785c. Alternatively, the light-emitting layer 782 may be formed with the intermediate layer 785a, the light-emitting layer 786a, the intermediate layer 785b, the light-emitting layer 786b, the light-emitting layer 786c, and the intermediate layer 785d; the intermediate layer 785c may be omitted.

Further, the intermediate layer can be formed using a stacked-layer structure including any of a hole-injection layer, a hole-transport layer, an electron-transport layer, an electron-injection layer, and the like. Note that not all of these layers need to be provided as the intermediate layer. Any of these layers may be selected as appropriate to form the intermediate layer. Note that layers having similar functions may be provided. Further, an electron-relay layer or the like may be added as appropriate as the intermediate layer, in addition to a carrier generation layer.

The electrode 781 can be formed using a conductive film having a transmitting property with respect to visible light. To have a transmitting property with respect to visible light means that the average transmittance of light in a visible light region (for example, a wavelength range from 400 nm to 800 nm) is higher than or equal to 70%, particularly higher than or equal to 80%.

As the electrode 781, for example, an oxide film such as an In—Zn—W oxide film, an In—Sn oxide film, an In—Zn oxide film, an In oxide film, a Zn oxide film, or a Sn oxide film may be used. The above oxide film may contain a minute amount of Al, Ga, Sb, F, or the like. Further, a metal thin film having a thickness enough to transmit light (preferably, approximately 5 nm to 30 nm) can also be used. For example, an Ag film, a Mg film, or an Ag—Mg alloy film with a thickness of 5 nm may be used.

The electrode 781 is preferred to be a film which efficiently reflects visible light. For example, a film containing lithium, aluminum, titanium, magnesium, lanthanum, silver, silicon, or nickel can be used as the electrode 781.

The electrode 783 can be formed using any of the films for the electrode 781. Note that when the electrode 781 has a transmitting property with respect to visible light, it is preferred that the electrode 783 efficiently reflect visible light. When the electrode 781 efficiently reflects visible light, it is preferred that the electrode 783 have a transmitting property with respect to visible light.

Positions of the electrode 781 and the electrode 783 are not limited to the structure illustrated in FIG. 18B, and the electrode 781 and the electrode 783 may be replaced with each other. It is preferred to use a conductive film having a high work function for the electrode which serves as an anode and a conductive film having a low work function for the electrode which serves as a cathode. Note that in the case where a carrier generation layer is provided in contact with the anode, a variety of conductive films can be used for the anode regardless of their work functions.

The partition 784 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, a resin film of a polyimide resin, an acrylic resin, an epoxy resin, a silicone resin, or the like may be used.

The transistor 741 connected to the light-emitting element 719 has excellent on-state characteristics and stable electric characteristics. Therefore, a display device having high display quality can be provided.

Next, the display device including a liquid crystal element is described.

Figure 19A:
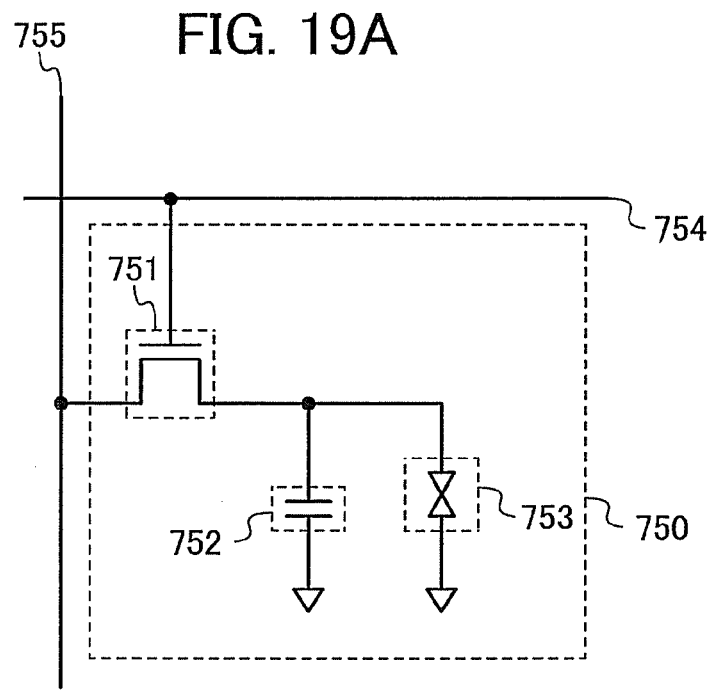
FIGS. 19A and 19B are a circuit diagram and a cross-sectional view of a pixel of a display device including a liquid crystal element of one embodiment of the present invention.

FIG. 19A is a circuit diagram illustrating a structure example of the pixel of the display device including a liquid crystal element. A pixel 750 illustrated in FIG. 19A includes a transistor 751, a capacitor 752, and an element in which a space between a pair of electrodes is filled with liquid crystal (hereinafter also referred to as a liquid crystal element) 753.

One of a source and a drain of the transistor 751 is electrically connected to a signal line 755, and a gate of the transistor 751 is electrically connected to a scan line 754.

One of electrodes of the capacitor 752 is electrically connected to the other of the source and the drain of the transistor 751, and the other of the electrodes of the capacitor 752 is electrically connected to a wiring for supplying a common potential.

One of electrodes of the liquid crystal element 753 is electrically connected to the other of the source and the drain of the transistor 751, and the other of the electrodes of the liquid crystal element 753 is electrically connected to a wiring for supplying a common potential. Note that the common potential supplied to the other of the electrodes of the liquid crystal element 753 may be different from the common potential supplied to the wiring electrically connected to the other of the electrodes of the capacitor 752.

Figure 19B:
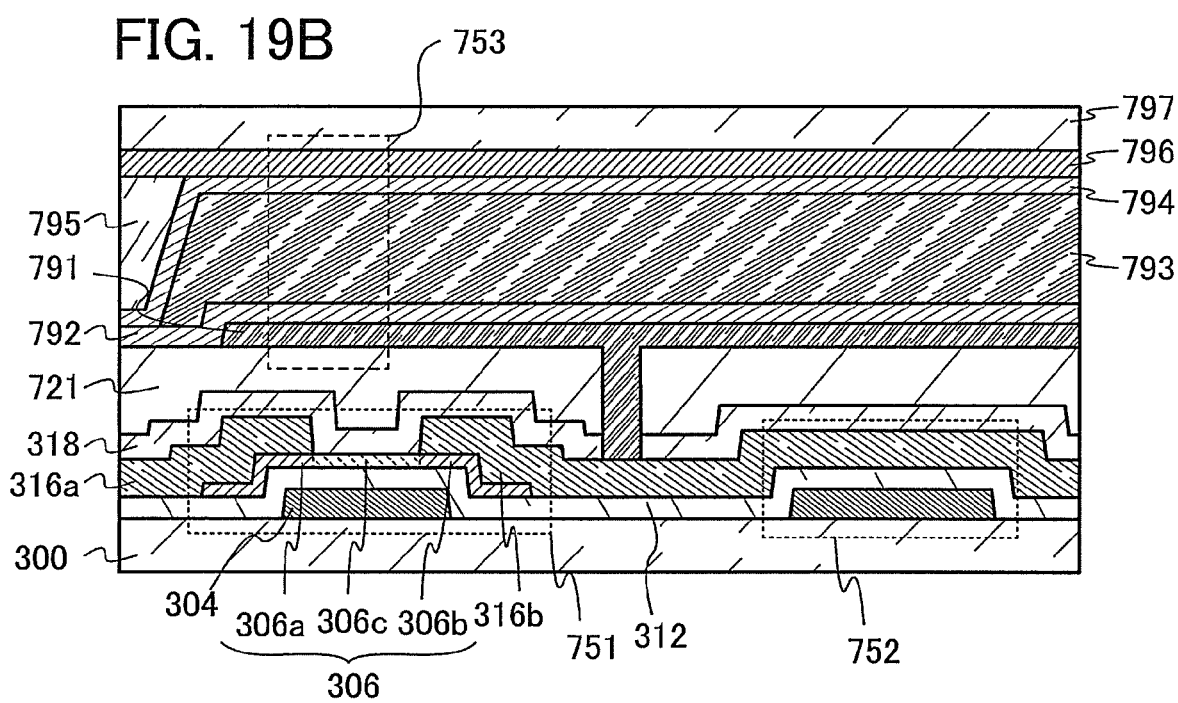

FIG. 19B illustrates part of a cross section of the pixel 750. Note that FIG. 19B shows an example where the transistor 751 and the capacitor 752 are provided in the same plane. With such a structure, the capacitor 752 can be formed in the same plane as a gate electrode, a gate insulating film, and a source electrode (drain electrode), which are included in the transistor 751. When the transistor 751 and the capacitor 752 are provided in the same plane in this manner, the number of manufacturing steps of the display device can be reduced; thus, the productivity can be increased.

As the transistor 751, any of the transistors described in the above embodiment can be used. In FIG. 19B, the transistor illustrated in FIGS. 8A to 8C is used as the transistor 751. Thus, for components of the transistor 751 which are not particularly described below, refer to the description in the above embodiment. Note that the transistor 751 has a structure in which the protective insulating film 318 is added to the transistor illustrated in FIGS. 8A to 8C.

Note that the transistor 751 can be a transistor having extremely low off-state current. Thus, charge held in the capacitor 752 is unlikely to leak and a voltage applied to the liquid crystal element 753 can be retained for a long time. Accordingly, when a motion image with less movement or a still image is displayed, power for operating the transistor 751 is not needed by turning off the transistor 751, whereby a display device with low power consumption can be obtained.

An insulating film 721 is provided over the transistor 751 and the capacitor 752.

Here, an opening reaching the drain electrode 316b of the transistor 751 is provided in the insulating film 721 and the protective insulating film 318.

An electrode 791 is provided over the insulating film 721. The electrode 791 is in contact with the drain electrode 316b of the transistor 751 through the opening provided in the insulating film 721 and the protective insulating film 318.

An insulating film 792 serving as an alignment film is provided over the electrode 791.

A liquid crystal layer 793 is provided over the insulating film 792.

An insulating film 794 serving as an alignment film is provided over the liquid crystal layer 793.

A spacer 795 is provided over the insulating film 794.

An electrode 796 is provided over the spacer 795 and the insulating film 794.

A substrate 797 is provided over the electrode 796.

The insulating film 721 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, a resin film of a polyimide resin, an acrylic resin, an epoxy resin, a silicone resin, or the like may be used.

For the liquid crystal layer 793, a thermotropic liquid crystal, a low-molecular liquid crystal, a polymer liquid crystal, a polymer-dispersed liquid crystal, a ferroelectric liquid crystal, an anti-ferroelectric liquid crystal, or the like can be used.

Such a liquid crystal material exhibits a cholesteric phase, a smectic phase, a cubic phase, a chiral nematic phase, an isotropic phase, or the like depending on conditions.

For the liquid crystal layer 793, a liquid crystal exhibiting a blue phase may be used. In that case, the insulating films 792 and 794 serving as an alignment film are not necessarily.

The electrode 791 can be formed using a conductive film having a transmitting property with respect to visible light.

As the electrode 791, for example, an oxide film such as an In—Zn—W oxide film, an In—Sn oxide film, an In—Zn oxide film, an In oxide film, a Zn oxide film, or a Sn oxide film may be used. The above oxide film may contain a minute amount of Al, Ga, Sb, F, or the like. Further, a metal thin film having a thickness enough to transmit light (preferably, approximately 5 nm to 30 nm) can also be used.

The electrode 791 is preferred to be a film which efficiently reflects visible light. For example, a film containing aluminum, titanium, chromium, copper, molybdenum, silver, tantalum, or tungsten can be used as the electrode 791.

The electrode 796 can be formed using any of the films for the electrode 791. Note that when the electrode 791 has a transmitting property with respect to visible light, it is preferred that the electrode 796 efficiently reflect visible light. When the electrode 791 efficiently reflects visible light, it is preferred that the electrode 796 have a transmitting property with respect to visible light.

Positions of the electrode 791 and the electrode 796 are not limited to the structure illustrated in FIG. 19B, and the electrode 791 and the electrode 796 may be replaced with each other.

Each of the insulating films 792 and 794 may be formed using an organic compound or an inorganic compound.

The spacer 795 may be formed using an organic compound or an inorganic compound. Note that the spacer 795 can have a variety of shapes such as a columnar shape and a spherical shape.

A region where the electrode 791, the insulating film 792, the liquid crystal layer 793, the insulating film 794, and the electrode 796 overlap with one another serves as the liquid crystal element 753.

As the substrate 797, a glass substrate, a resin substrate, a metal substrate, or the like can be used. The substrate 797 may have flexibility.

The transistor 751 connected to the liquid crystal element 753 has excellent on-state characteristics and stable electric characteristics. Therefore, a display device having high display quality can be provided. Since the transistor 751 can have extremely low off-state current, a display device with low power consumption can be provided.

This embodiment can be implemented in appropriate combination with any of the other embodiments and examples.

(Embodiment 9)

In this embodiment, examples of an electronic device including any of the semiconductor devices described in the above embodiments will be described.

Figure 20A:
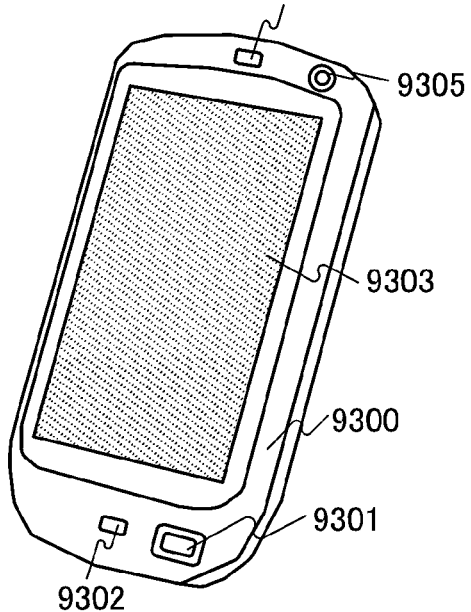
FIGS. 20A to 20D illustrate electronic devices of one embodiment of the present invention.

FIG. 20A illustrates a portable information terminal. The portable information terminal illustrated in FIG. 20A includes a housing 9300, a button 9301, a microphone 9302, a display portion 9303, a speaker 9304, and a camera 9305, and has a function as a mobile phone. One embodiment of the present invention can be applied to an arithmetic unit, a wireless circuit, or a memory circuit in a main body. One embodiment of the present invention can also be applied to the display portion 9303.

Figure 20B:
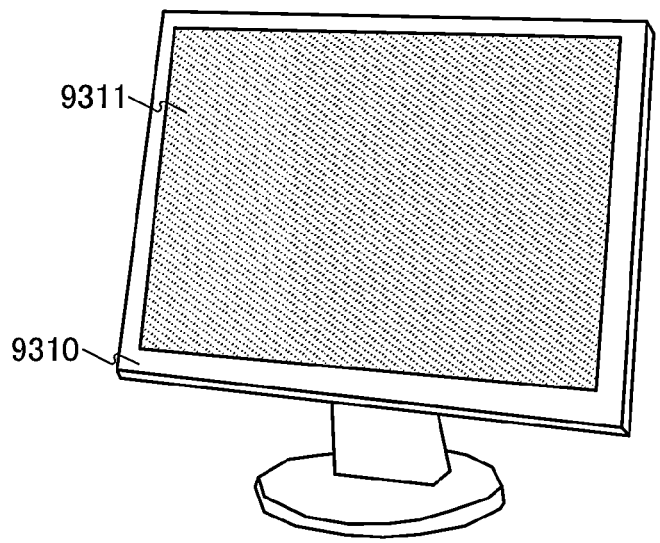

FIG. 20B illustrates a display. The display illustrated in FIG. 20B includes a housing 9310 and a display portion 9311. One embodiment of the present invention can be applied to an arithmetic unit, a wireless circuit, or a memory circuit in a main body. One embodiment of the present invention can also be applied to the display portion 9311.

Figure 20C:
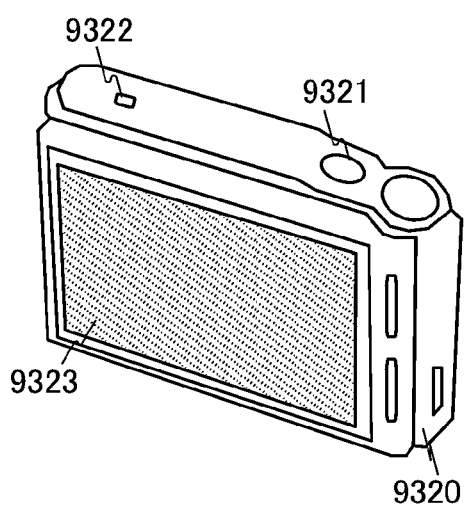

FIG. 20C illustrates a digital still camera. The digital still camera illustrated in FIG. 20C includes a housing 9320, a button 9321, a microphone 9322, and a display portion 9323. One embodiment of the present invention can be applied to an arithmetic unit, a wireless circuit, or a memory circuit in a main body. One embodiment of the present invention can also be applied to the display portion 9323.

Figure 20D:
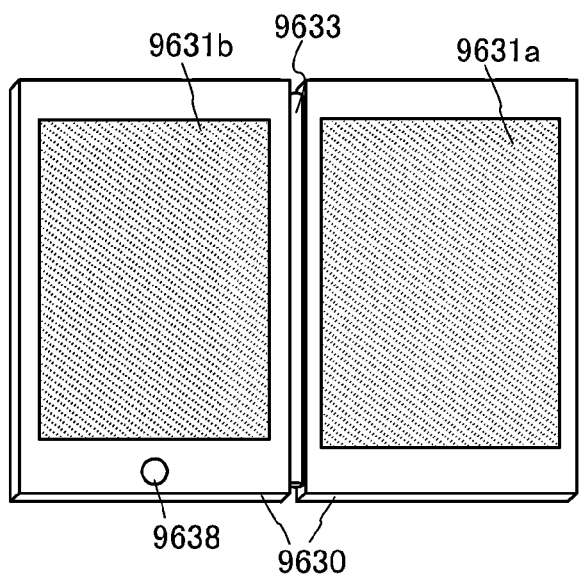

FIG. 20D illustrates a double-foldable portable information terminal. The double-foldable portable information terminal illustrated in FIG. 20D includes a housing 9630, a display portion 9631a, a display portion 9631b, a hinge 9633, and an operation switch 9638. One embodiment of the present invention can be applied to an arithmetic unit, a wireless circuit, or a memory circuit in a main body. One embodiment of the present invention can also be applied to the display portion 9631a and the display portion 9631b.

Part or whole of the display portion 9631a and/or the display portion 9631b can function as a touch panel. By touching an operation key displayed on the touch panel, a user can input data, for example.

With the use of a semiconductor device according to one embodiment of the present invention, an electronic device with high performance and low power consumption can be provided.

This embodiment can be implemented in appropriate combination with any of the other embodiments and examples.

Example 1

This example describes an example in which a process for increasing the resistance of an oxide semiconductor film is performed.

A method for forming samples is described below.

First, a glass substrate was prepared.

Then a silicon oxide film was formed to a thickness of 300 nm.

Next, a CMP process was performed to reduce roughness of the top surface of the silicon oxide film and to planarize the surface of the silicon oxide film.

Subsequently, an aluminum oxide film was formed to a thickness of 10 nm.

After that, a first oxide semiconductor film was formed to a thickness of 10 nm, 15 nm, or 30 nm. The first oxide semiconductor film was formed by a sputtering method using an In—Ga—Zn oxide (In:Ga:Zn=1:1:1 [atomic ratio]) target under the following conditions: a flow rate of an oxygen gas was 45 sccm, the pressure was controlled to 0.4 Pa, the distance between a substrate and the target was 60 mm, the substrate temperature was 300° C., and a power of 0.5 kW (DC) was applied.

Alternatively, a second oxide semiconductor film was formed to a thickness of 5 nm, 10 nm, 15 nm, or 30 nm. The second oxide semiconductor film was formed by a sputtering method using an In—Sn—Zn oxide (In:Sn:Zn=1:1:1 [atomic ratio]) target under the following conditions: a flow rate of an oxygen gas was 50 sccm, the pressure was controlled to 0.4 Pa, the distance between a substrate and the target was 60 mm, the substrate temperature was 200° C., and a power of 0.5 kW (DC) was applied.

Next, the formed samples were subjected to a laser process. The laser process was performed with an excimer laser which emits light having an emission wavelength of 308 nm, with an energy density greater than or equal to 120.9 mJ/cm$^2$ and less than or equal to 700.4 mJ/cm$^2$.

Figure 21A:
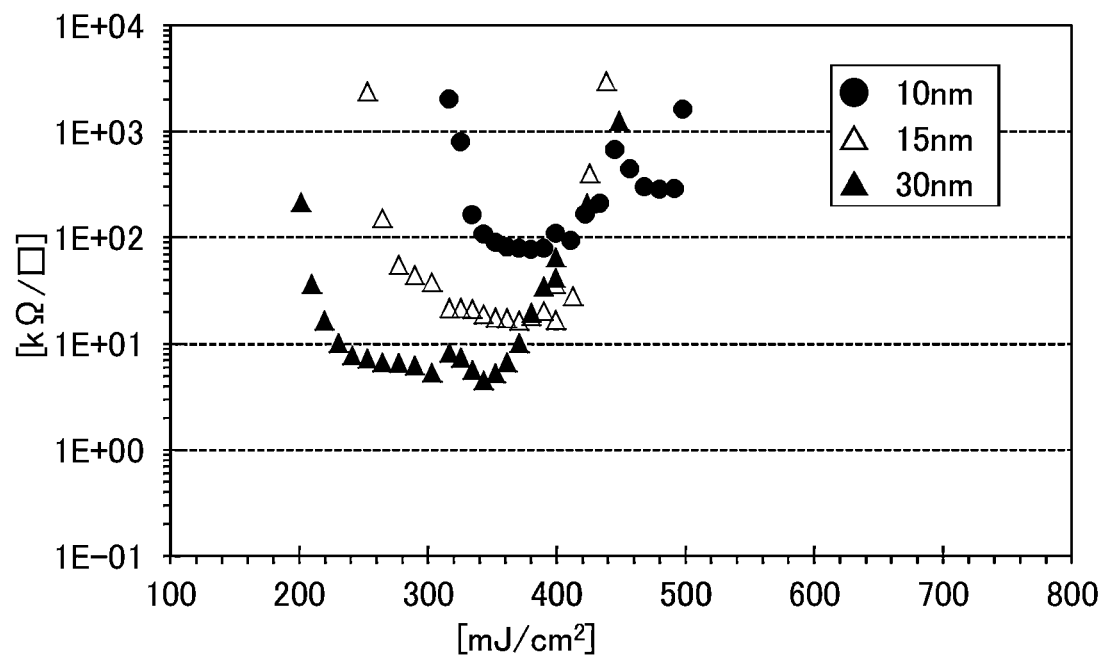
FIGS. 21A and 21B are graphs each showing the sheet resistance of oxide semiconductor films after a laser process.
Figure 21B:
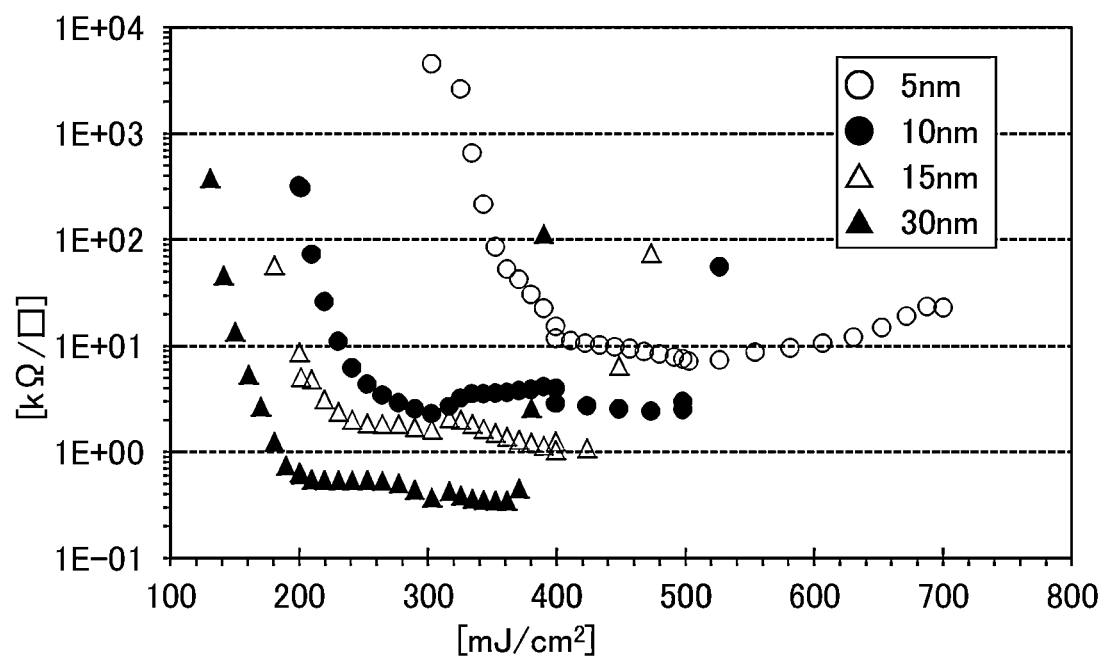

FIGS. 21A and 21B show relations between the energy density and the sheet resistance of the samples after the laser process. The sheet resistance was measured by a four-probe method. Note that in FIGS. 21A and 21B, hollow circles are plots of the sample including a 5-nm-thick oxide semiconductor film (not found in FIG. 21A), solid circles are plots of the sample including a 10-nm-thick oxide semiconductor film, hollow triangles are plots of the sample including a 15-nm-thick oxide semiconductor film, and solid triangles are plots of the sample including a 30-nm-thick oxide semiconductor film. FIG. 21A shows the relations between the energy density and the sheet resistance of the samples including the first oxide semiconductor film, and FIG. 21B show the relations between the energy density and the sheet resistance of the samples including the second oxide semiconductor film.

FIGS. 21A and 21B show that it is possible to reduce the sheet resistance of the oxide semiconductor film by adjusting the energy density of the laser process.

Then, the crystal states of samples in which an oxide semiconductor film was subjected to a laser process were evaluated. The crystal state was evaluated by an X-ray diffraction (XRD) and with a transmission electron microscope (TEM).

The XRD measurement was conducted using an X-ray diffractometer D8 ADVANCE manufactured by Bruker AXS, and the measurement was performed by an out-of-plane method. Note that H-9000NAR manufactured by Hitachi, Ltd was used as the TEM.

A method for forming samples is described below.

First, a glass substrate was prepared.

Then a silicon oxide film was formed to a thickness of 300 nm

Subsequently, an aluminum oxide film was formed to a thickness of 20 nm.

After that, an oxide semiconductor film was formed to a thickness of 30 nm. The oxide semiconductor film was formed by a sputtering method using an In—Ga—Zn oxide (In:Ga:Zn=1:1:1 [atomic ratio]) target under the following conditions: a flow rate of an argon gas was 30 sccm and a flow rate of an oxygen gas was 15 sccm, the pressure was controlled to 0.4 Pa, the distance between a substrate and the target was 60 mm, the substrate temperature was 300° C., and a power of 0.5 kW (DC) was applied.

Next, the formed samples were subjected to a laser process. The laser process was performed with an excimer laser which emits light having an emission wavelength of 308 nm, with an energy density of 140 mJ/cm$^2$, 201 mJ/cm$^2$, 300 mJ/cm$^2$, 349 mJ/cm$^2$, or 451 mJ/cm$^2$.

Figure 22:
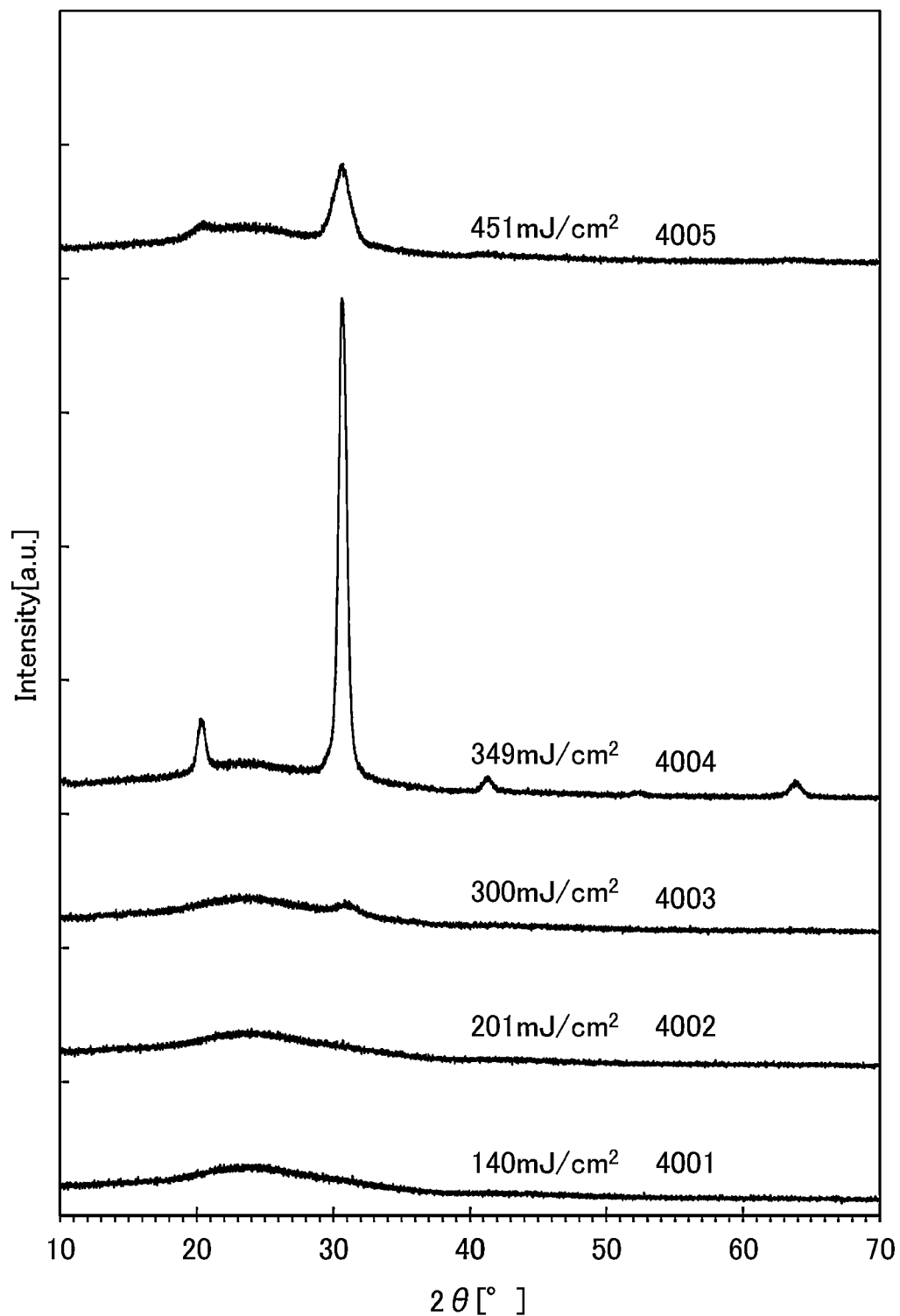
FIG. 22 is a graph showing XRD results of oxide semiconductor films after a laser process.

Next, the samples were measured by XRD. The results are shown in FIG. 22. Note that in FIG. 22, a curve 4001, a curve 4002, a curve 4003, a curve 4004, and a curve 4005 are for the samples obtained with energy densities of 140 mJ/cm$^2$, 201 mJ/cm$^2$, 300 mJ/cm$^2$, 349 mJ/cm$^2$, and 451 mJ/cm$^2$, respectively.

In FIG. 22, no particular peak of diffraction intensity can be seen for the samples obtained with energy densities of 140 mJ/cm$^2$ and 201 mJ/cm$^2$. Meanwhile, a peak of diffraction intensity of the (0 0 9) plane can be seen for the sample obtained with an energy density of 300 mJ/cm$^2$. Further, peaks of diffraction intensity of the (0 0 6) plane, the (0 0 9) plane, the (0 0 12) plane, the (0 0 15) plane, and the (0 0 18) plane can be seen for the sample obtained with an energy density of 349 mJ/cm$^2$; the peak of diffraction intensity of the (0 0 9) plane is particularly high. In addition, peaks of diffraction intensity of the (0 0 6) plane and the (0 0 9) plane can be seen for the sample obtained with an energy density of 451 mJ/cm$^2$. Note that the peaks of diffraction intensity of the (0 0 6) plane, the (0 0 9) plane, the (0 0 12) plane, the (0 0 15) plane, and the (0 0 18) plane exist where 2θ=20.42°, 2θ=30.84°, 2θ=41.52°, 2θ=52.62°, and 2θ=64.23°, respectively.

Then, transmitted electron (TE) images (also referred to as TEM images) of cross sections of the same samples were observed with a TEM. Note that the acceleration voltage was 300 kV and the magnification was 4000000 times. The results are shown in FIGS. 23A and 23B, FIGS. 24A and 24B, and FIGS. 25A and 25B. FIG. 23A, FIG. 23B, FIG. 24A, FIG. 24B, and FIG. 25A show the results of the samples obtained with energy densities of 140 mJ/cm$^2$, 201 mJ/cm$^2$, 300 mJ/cm$^2$, 349 mJ/cm$^2$, and 451 mJ/cm$^2$, respectively.

Figure 23A:
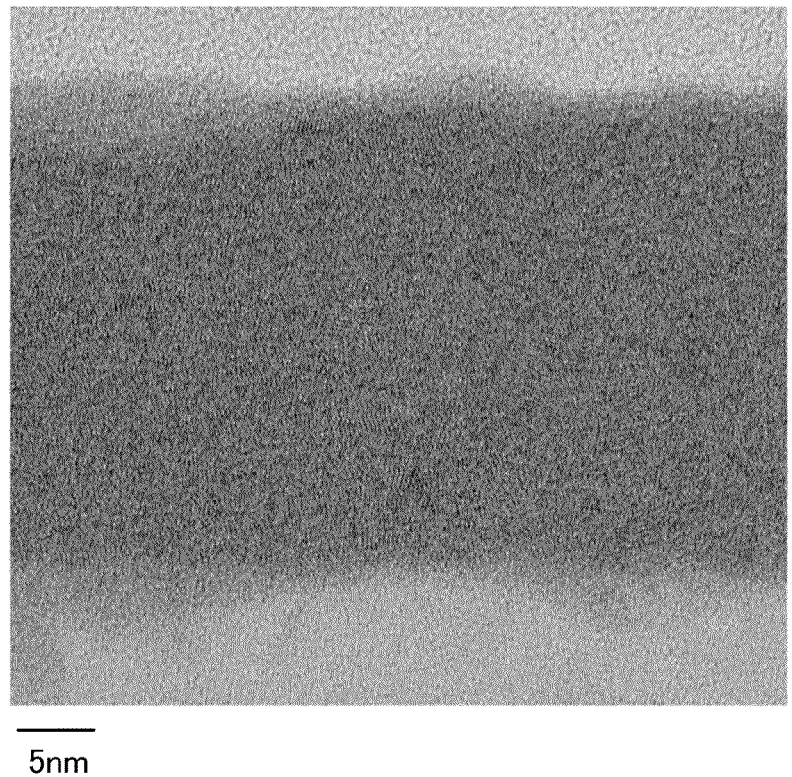
FIGS. 23A and 23B are cross-sectional TE images of oxide semiconductor films after a laser process.
Figure 23B:
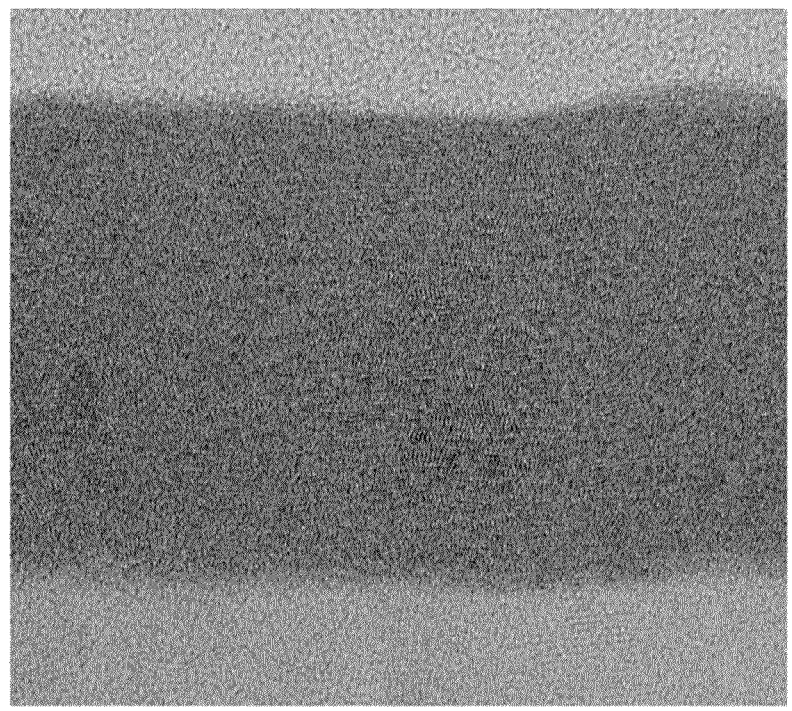
Figure 24A:
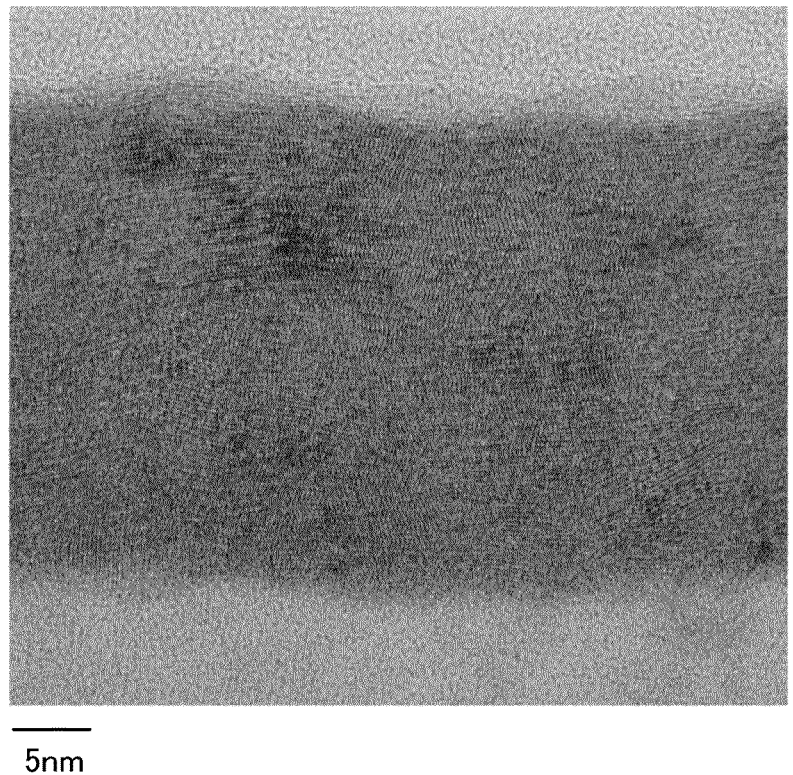
FIGS. 24A and 24B are cross-sectional TE images of oxide semiconductor films after a laser process.
Figure 24B:
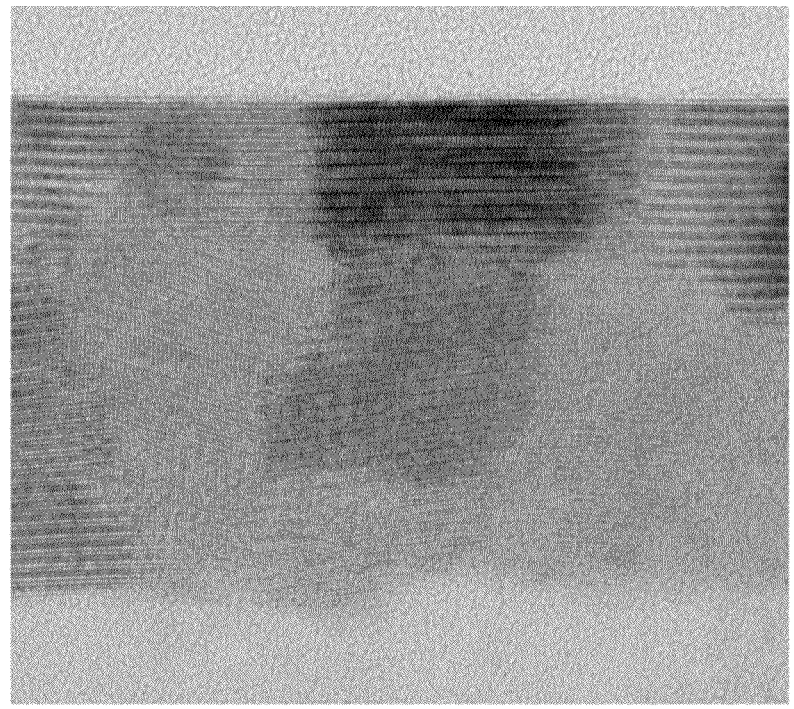
Figure 25A:
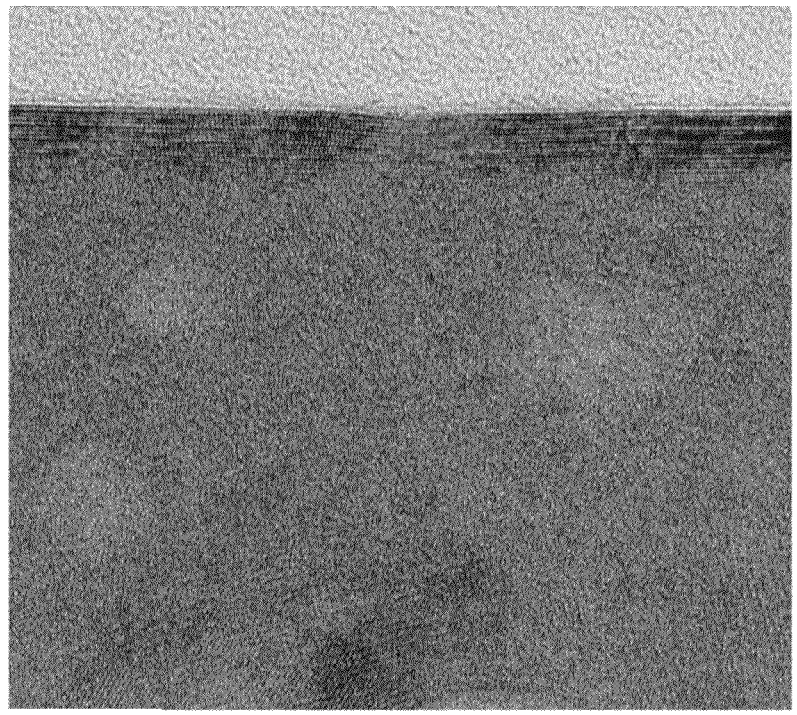
FIGS. 25A and 25B are cross-sectional TE images of oxide semiconductor films after a laser process.
Figure 25B:
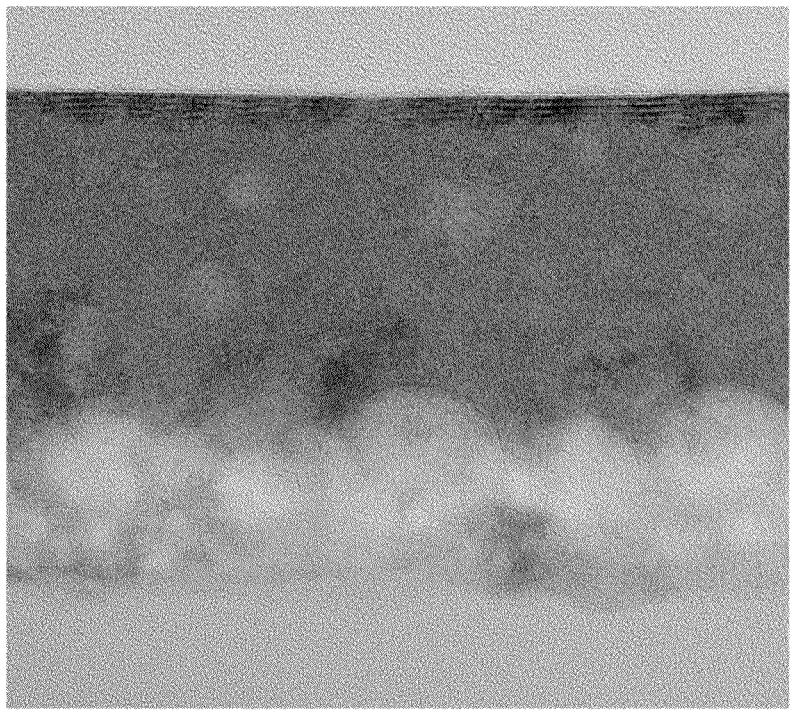

FIGS. 23A and 23B show that oxide semiconductor films in the samples obtained with energy densities of 140 mJ/cm$^2$ and 201 mJ/cm$^2$ are amorphous. FIG. 24A shows that an oxide semiconductor film in the sample obtained with an energy density of 300 mJ/cm$^2$ is crystallized. FIG. 24B shows that an oxide semiconductor film in the sample obtained with an energy density of 349 mJ/cm$^2$ is crystallized. This sample is polycrystalline. FIGS. 25A and 25B show that an oxide semiconductor film in the sample obtained with an energy density of 451 mJ/cm$^2$ is crystallized. The crystallinity of this sample is lower than that of the sample obtained with an energy density of 349 mJ/cm$^2$. Note that FIG. 25B is a TE image of the observation portion in FIG. 25A observed with a magnification of 2000000 times. As can be seen in FIG. 25B, a mixed layer of a silicon oxynitride film, an aluminum oxide film, and an oxide semiconductor film is formed in the sample obtained with an energy density of 451 mJ/cm$^2$.

From the above, it is found that an increase in energy density of a laser process enables an oxide semiconductor film to be crystallized. However, it is also found that too high energy density of a laser process causes a reduction in crystallinity and formation of a mixed region of the oxide semiconductor film and a base film. Accordingly, it is important that a laser process needs to be performed with an appropriate energy density to increase the crystallinity of an oxide semiconductor film.

Comparisons of the sheet resistance and the crystal states of oxide semiconductor films give that the sheet resistance of the oxide semiconductor film is reduced because the oxide semiconductor film is crystallized. The comparisons also give that too high energy density of a laser process causes a reduction in crystallinity and formation of a mixed region of the oxide semiconductor film and a base film, resulting in an increase in sheet resistance.

Example 2

This example describes an example in which a process for increasing the resistance of an oxide semiconductor film whose resistance is reduced by a laser process is performed.

A method for forming samples is described below.

First, a glass substrate was prepared.

Then a silicon oxide film was formed to a thickness of 300 nm.

Subsequently, an aluminum oxide film was formed to a thickness of 10 nm.

After that, a first oxide semiconductor film was formed to a thickness of 30 nm. The first oxide semiconductor film was formed by a sputtering method using an In—Ga—Zn oxide (In:Ga:Zn=1:1:1 [atomic ratio]) target under the following conditions: a flow rate of an oxygen gas was 45 sccm, the pressure was controlled to 0.4 Pa, the distance between a substrate and the target was 60 mm, the substrate temperature was 300° C., and a power of 0.5 kW (DC) was applied.

Alternatively, a second oxide semiconductor film was formed to a thickness of 15 nm. The second oxide semiconductor film was formed by a sputtering method using an In—Sn—Zn oxide (In:Sn:Zn=2:1:3 [atomic ratio]) target under the following conditions: a flow rate of an oxygen gas was 50 sccm, the pressure was controlled to 0.4 Pa, the distance between a substrate and the target was 60 mm, the substrate temperature was 200° C., and a power of 0.5 kW (DC) was applied.

Next, the formed samples were subjected to a laser process. The laser process was performed with an excimer laser which emits light having an emission wavelength of 308 nm. The sample including the first oxide semiconductor film was obtained with an energy density of 391 mJ/cm$^2$ and the sample including the second oxide semiconductor film was obtained with an energy density of 298 mJ/cm$^2$.

Other formed samples were subjected to heat treatment. The samples were heated at 450° C. in a nitrogen gas atmosphere for one hour and then heated at 450° C. in an oxygen gas atmosphere for one hour.

Then, the oxide semiconductor film was processed to form an island-shaped oxide semiconductor film.

After that, a silicon oxynitride film was formed to a thickness of 100 nm.

Some of the samples were implanted with oxygen ions. The oxygen ions were implanted at an acceleration voltage of 25 kV with a dosage of $1 \times 10^{16}$ ions/cm$^2$.

Next, an aluminum oxide film was formed to a thickness of 50 nm.

Subsequently, a silicon oxynitride film was formed to a thickness of 300 nm.

Then, the 100-nm-thick silicon oxynitride film, the 50-nm-thick aluminum oxide film, and the 300-nm-thick silicon oxynitride film were processed so that part of the oxide semiconductor film was exposed.

After that, a titanium film was formed to a thickness of 300 nm.

Next, the titanium film was processed so that a pair of electrodes at least partly in contact with the oxide semiconductor film was formed.

Subsequently, the formed samples were subjected to heat treatment. The samples were heated at 300° C. in an air atmosphere for one hour.

Then, the resistance between the electrodes formed using a titanium film was measured. Note that the electrodes were provided apart from each other. Since the pair of electrodes was formed using a titanium film, the resistance thereof was sufficiently lower than that of the oxide semiconductor film; thus, the resistance between the electrodes was almost the same as that of the oxide semiconductor film.

A region of the oxide semiconductor film which was between the electrodes had a width of 69100 µm and the distance between the electrodes of 3 µm, 10 µm, 50 µm, 100 µm, 200 µm, or 500 µm. Then, the resistance was measured at six points in one sample. Next, the distance between the electrodes and the resistance measured at six points were plotted on the lateral axis and the vertical axis, respectively. After that, the slope of a straight line obtained by linear approximation of the plots was multiplied by the electrode width (69100 µm) to obtain the sheet resistance.

Figure 26:
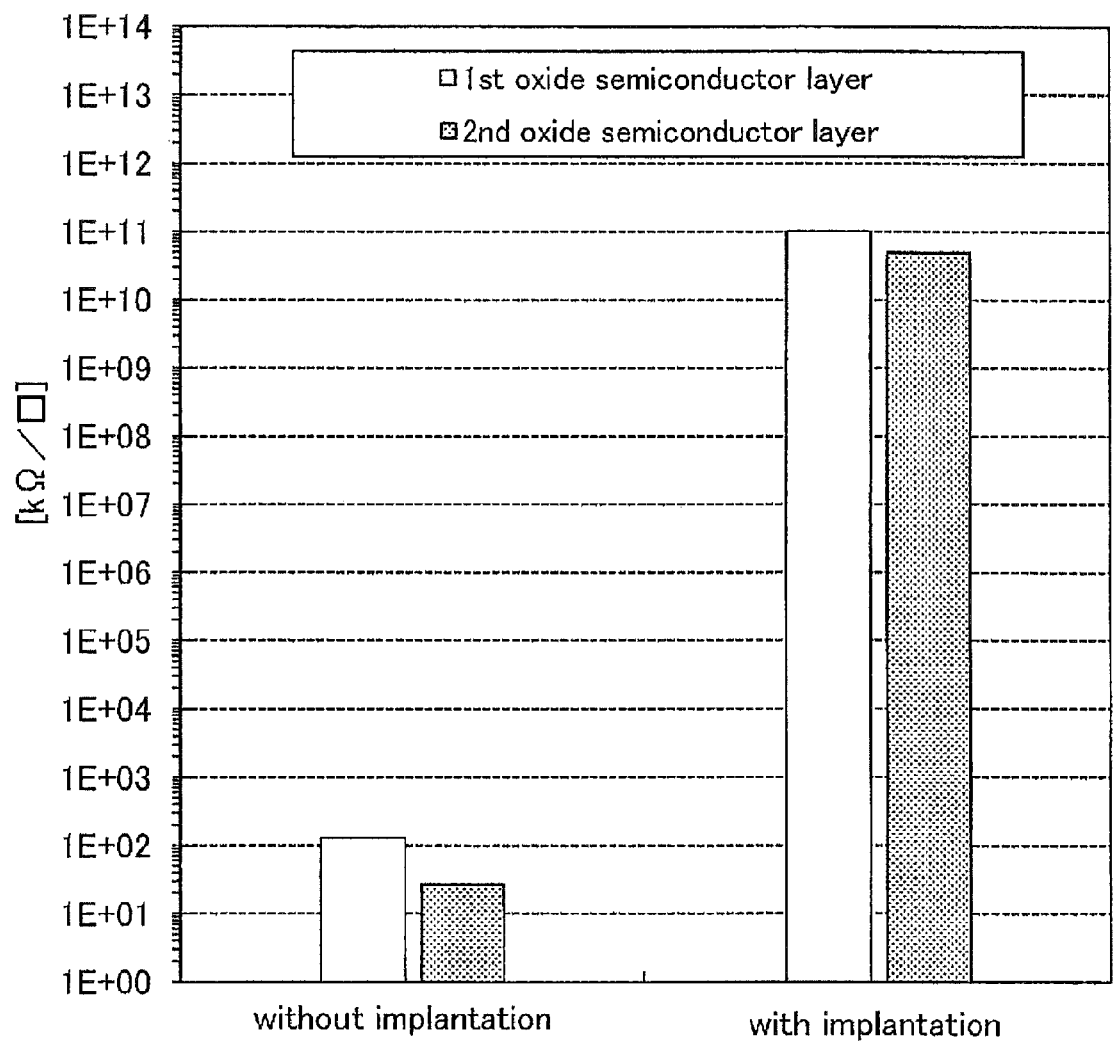
FIG. 26 is a graph showing the resistance of oxide semiconductor films after a laser process and the resistance of the oxide semiconductor films subjected to implantation of oxygen ions.

FIG. 26 shows the sheet resistance of each sample and compares the samples with and without oxygen ion implantation. In FIG. 26, a hollow bar represents the sheet resistance of the sample including the first oxide semiconductor film, and a shaded bar represents the sheet resistance of the sample including the second oxide semiconductor film.

FIG. 26 shows that the resistivity of the oxide semiconductor film which is reduced by the laser process increases by the implantation of oxygen ions in all the samples.

This application is based on Japanese Patent Application serial no. 2012-123951 filed with Japan Patent Office on May 31, 2012, the entire contents of which are hereby incorporated by reference.

What is claimed is:

1. A method for manufacturing a semiconductor device, comprising the steps of:
    forming an oxide semiconductor layer over an insulating surface;
    performing a first treatment so that a resistance of the oxide semiconductor layer is reduced;
    forming a first insulating layer over the oxide semiconductor layer after performing the first treatment;
    forming a sacrificial layer overlapping with a part of the oxide semiconductor layer with the first insulating layer interposed therebetween;
    forming a second insulating layer over the sacrificial layer;
    removing a part of the second insulating layer and a part of the sacrificial layer so that a top surface of the sacrificial layer is exposed and the top surface of the sacrificial layer is substantially flush with a top surface of the rest of the second insulating layer;
    removing the sacrificial layer, thereby forming a third insulating layer which does not cover a part of the first insulating layer;
    performing a second treatment after removing the sacrificial layer;
    forming a conductive layer over the first insulating layer and the third insulating layer after performing the second treatment; and
    forming a gate electrode by processing the conductive layer so that a top surface of the third insulating layer is exposed and a top surface of the processed conductive layer is substantially flush with the top surface of the third insulating layer,
    wherein the second treatment is performed so that a resistance of only a region in the oxide semiconductor layer is increased,
    wherein the region does not overlap with the third insulating layer, and
    wherein the first treatment is performed before forming any layer over and in contact with the oxide semiconductor layer.

2. The method for manufacturing a semiconductor device according to claim 1, wherein the region is a channel region of a transistor.

3. The method for manufacturing a semiconductor device according to claim 1, wherein heat treatment at a temperature higher than or equal to 450 ° C. and lower than or equal to 740 ° C. is performed in the first treatment.

4. The method for manufacturing a semiconductor device according to claim 1, further comprising the step of forming a fourth insulating layer comprising the insulating surface, wherein the fourth insulating layer contains excess oxygen.

5. The method for manufacturing a semiconductor device according to claim 1, further comprising the step of forming a fifth insulating layer over and in contact with the oxide semiconductor layer after performing the first treatment, wherein the fifth insulating layer contains excess oxygen.

6. A method for manufacturing a semiconductor device, comprising the steps of:
    forming an oxide semiconductor layer over an insulating surface;

performing a first treatment so that a resistance of the oxide semiconductor layer is reduced;

forming a first insulating layer over the oxide semiconductor layer after performing the first treatment;

forming a sacrificial layer overlapping with a part of the oxide semiconductor layer with the first insulating layer interposed therebetween;

forming a second insulating layer over the sacrificial layer;

removing a part of the second insulating layer and a part of the sacrificial layer so that a top surface of the sacrificial layer is exposed and the top surface of the sacrificial layer is substantially flush with a top surface of the rest of the second insulating layer;

removing the sacrificial layer, thereby forming a third insulating layer which does not cover a part of the first insulating layer;

performing a second treatment after removing the sacrificial layer;

forming a conductive layer over the first insulating layer and the third insulating layer after performing the second treatment; and forming a gate electrode by processing the conductive layer so that a top surface of the third insulating layer is exposed and a top surface of the processed conductive layer is substantially flush with the top surface of the third insulating layer, wherein the second treatment is performed so that a resistance of only a region in the oxide semiconductor layer is increased, wherein the region does not overlap with the third insulating layer, wherein the first treatment is performed before forming any layer over and in contact with the oxide semiconductor layer, and wherein plasma oxidation or implantation of oxygen ions is performed in the second treatment.

7. The method for manufacturing a semiconductor device according to claim 6, wherein the region is a channel region of a transistor.

8. The method for manufacturing a semiconductor device according to claim 6, wherein heat treatment at a temperature higher than or equal to 450 ° C. and lower than or equal to 740 ° C. is performed in the first treatment.

9. The method for manufacturing a semiconductor device according to claim 6, further comprising the step of forming a fourth insulating layer comprising the insulating surface, wherein the fourth insulating layer contains excess oxygen.

10. The method for manufacturing a semiconductor device according to claim 6, further comprising the step of forming a fifth insulating layer over and in contact with the oxide semiconductor layer after performing the first treatment, wherein the fifth insulating layer contains excess oxygen.

11. A method for manufacturing a semiconductor device, comprising the steps of:

forming an oxide semiconductor layer over an insulating surface;

performing a first treatment so that a resistance of the oxide semiconductor layer is reduced;

forming a first insulating layer over the oxide semiconductor layer after performing the first treatment;

forming a sacrificial layer overlapping with a part of the oxide semiconductor layer with the first insulating layer interposed therebetween;

forming a second insulating layer over the sacrificial layer;

removing a part of the second insulating layer and a part of the sacrificial layer so that a top surface of the sacrificial layer is exposed and the top surface of the sacrificial layer is substantially flush with a top surface of the rest of the second insulating layer;

removing the sacrificial layer, thereby forming a third insulating layer which does not cover a part of the first insulating layer;

performing a second treatment after removing the sacrificial layer;

forming a conductive layer over the first insulating layer and the third insulating layer after performing the second treatment; and forming a gate electrode by processing the conductive layer so that a top surface of the third insulating layer is exposed and a top surface of the processed conductive layer is substantially flush with the top surface of the third insulating layer, wherein the second treatment is performed so that a resistance of only a region in the oxide semiconductor layer is increased, wherein the region does not overlap with the third insulating layer, wherein the first treatment is performed before forming any layer over and in contact with the oxide semiconductor layer, and wherein a laser process is performed in the first treatment.

12. The method for manufacturing a semiconductor device according to claim 11, wherein the region is a channel region of a transistor.

13. The method for manufacturing a semiconductor device according to claim 11, further comprising the step of forming a fourth insulating layer comprising the insulating surface, wherein the fourth insulating layer contains excess oxygen.

14. The method for manufacturing a semiconductor device according to claim 11, further comprising the step of forming a fifth insulating layer over and in contact with the oxide semiconductor layer after performing the first treatment, wherein the fifth insulating layer contains excess oxygen.

* * * * *